(12) United States Patent
Ahn et al.

(10) Patent No.: US 11,817,405 B2
(45) Date of Patent: Nov. 14, 2023

(54) SEMICONDUCTOR DEVICE AND METHOD OF FABRICATING THE SAME

(71) Applicant: Samsung Electronics Co., Ltd., Suwon-si (KR)

(72) Inventors: Sumin Ahn, Suwon-si (KR); Byungjun Kang, Suwon-si (KR); Jiyoung Kim, Seoul (KR); Hae Seok Park, Yongin-si (KR); Chulsoon Chang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 139 days.

(21) Appl. No.: 17/496,488

(22) Filed: Oct. 7, 2021

(65) Prior Publication Data

US 2022/0246556 A1 Aug. 4, 2022

(30) Foreign Application Priority Data

Feb. 1, 2021 (KR) .......................... 10-2021-0014033

(51) Int. Cl.
*H01L 23/00* (2006.01)
*H01L 23/498* (2006.01)
*H01L 21/48* (2006.01)

(52) U.S. Cl.
CPC ............ *H01L 24/02* (2013.01); *H01L 21/481* (2013.01); *H01L 23/49822* (2013.01); *H01L 23/49894* (2013.01); *H01L 24/05* (2013.01); *H01L 24/13* (2013.01); *H01L 24/16* (2013.01); *H01L 2224/0221* (2013.01); *H01L 2224/02206* (2013.01); *H01L 2224/02215* (2013.01); *H01L 2224/02311* (2013.01);
(Continued)

(58) Field of Classification Search
CPC ......... H01L 24/02; H01L 24/04; H01L 24/13; H01L 24/16; H01L 23/49822; H01L 23/49894; H01L 21/481
See application file for complete search history.

(56) References Cited

U.S. PATENT DOCUMENTS 6,150,261 A * 11/2000 Hsu .................. H01L 21/76892
257/E21.595
6,872,633 B2 3/2005 Huang et al.
(Continued)

FOREIGN PATENT DOCUMENTS

| KR | 100478496 B1 | 3/2005 |
|---|---|---|
| KR | 1020060076587 A | 7/2006 |
| KR | 100701692 B1 | 3/2007 |

*Primary Examiner* — Nathan W Ha
(74) *Attorney, Agent, or Firm* — Muir Patent Law, PLLC

(57) ABSTRACT

Disclosed are semiconductor devices and their fabricating methods. The semiconductor device comprises a dielectric layer, a trench formed in the dielectric layer, a metal pattern that conformally covers a top surface of the dielectric layer, an inner side surface of the trench, and a bottom surface of the trench, a first protection layer that conformally covers the metal pattern, and a second protection layer that covers the first protection layer. A cavity is formed in the trench. The cavity is surrounded by the first protection layer. The first protection layer has an opening that penetrates the first protection layer and extends from a top surface of the first protection layer. The opening is connected to the cavity. A portion of the second protection layer extends into the opening and closes the cavity.

20 Claims, 21 Drawing Sheets

(52) U.S. Cl.
CPC ............... *H01L 2224/05548* (2013.01); *H01L 2224/13024* (2013.01); *H01L 2224/16227* (2013.01)

(56) References Cited

U.S. PATENT DOCUMENTS

| | | |
|---|---|---|
| 6,946,359 B2 | 9/2005 | Yang et al. |
| 10,510,732 B2 | 12/2019 | Tsou et al. |
| 2006/0063378 A1* | 3/2006 | Lin .................. H01L 23/60 257/E23.152 |
| 2006/0081982 A1* | 4/2006 | Huang ............... H01L 23/3114 257/784 |
| 2006/0166498 A1* | 7/2006 | Kirby ............... H01L 21/76898 257/E21.597 |
| 2007/0264790 A1 | 11/2007 | Cho et al. |
| 2008/0251925 A1* | 10/2008 | Lin .................. H01L 27/0676 257/E23.152 |
| 2010/0127403 A1* | 5/2010 | Muta ................ H01L 23/49827 257/774 |
| 2012/0068330 A1* | 3/2012 | Oganesian ............ H01L 25/50 257/E23.141 |
| 2016/0266063 A1* | 9/2016 | Chang ............... B01L 3/502707 |
| 2018/0151519 A1* | 5/2018 | Lu .................. H01L 24/02 |
| 2019/0355682 A1* | 11/2019 | Sugioka ............... G03F 1/54 |
| 2021/0020592 A1* | 1/2021 | Sugioka ............... G03F 1/54 |
| 2021/0057370 A1* | 2/2021 | Komposch ........ H01L 21/76898 |

\* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0014033 filed on Feb. 1, 2021 in the Korean Intellectual Property Office, the disclosure of which is hereby incorporated by reference in its entirety.

BACKGROUND

The present inventive concepts relate to a semiconductor device and a method of fabricating the same.

Semiconductor devices have an important role in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry.

The recent rapid increase in integration of the semiconductor device requires extensive effort to achieve ultra-fine patterns. Therefore, techniques such as multi-layer lithography or double/triple patterning are suggested, and stacking of a plurality of layers and interconnection therebetween are needed to accomplish the techniques mentioned above. However, vertical connection structures for connection between wiring lines of the stacked layers may generate defects such as voids, and this may induce reduction in strength of the stacked layers in subsequent processes.

SUMMARY

Some example embodiments of the present inventive concepts provide a semiconductor device with increased structural stability and a method of fabricating the same.

Some example embodiments of the present inventive concepts provide a method of fabricating a semiconductor device in which method the occurrence of failure is reduced and a semiconductor device manufactured by the same.

An object of the present inventive concepts is not limited to the mentioned above, and other objects which have not been mentioned above will be clearly understood to those skilled in the art from the following description.

According to some example embodiments of the present inventive concepts, a semiconductor device may comprise: a dielectric layer; a trench formed in the dielectric layer; a metal pattern that conformally covers a top surface of the dielectric layer, an inner side surface of the trench, and a bottom surface of the trench; a first protection layer that conformally covers the metal pattern; and a second protection layer that covers the first protection layer. A cavity may be formed in the trench. The cavity may be surrounded by the first protection layer. The first protection layer may have an opening that penetrates the first protection layer and may extend from a top surface of the first protection layer to the cavity. The opening may be connected to the cavity. A portion of the second protection layer may extend into the opening and may close the cavity.

According to some example embodiments of the present inventive concepts, a method of fabricating a semiconductor device may comprise: forming a trench by performing an etching process on a dielectric layer; forming a metal pattern that conformally covers a top surface of the dielectric layer, an inner side surface of the trench, and a bottom surface of the trench, wherein a thickness of the metal pattern on the inner side surface of the trench decreases in a direction approaching the bottom surface of the trench; forming a first preliminary protection layer that conformally covers the metal pattern, wherein the first preliminary protection layer has a cavity in the trench; forming a first protection layer by performing a first planarization process on a top surface of the first preliminary protection layer, wherein after the first planarization process the cavity is connected to an outside through an opening formed in an upper portion of the first protection layer; forming a second preliminary protection layer that covers a top surface of the first protection layer and fills the opening; and forming a second protection layer by performing a second planarization process on a top surface of the second preliminary protection layer.

According to some example embodiments of the present inventive concepts, a semiconductor device may comprise: a base layer; a first conductive pattern on the base layer; a dielectric layer formed on the base layer and covering the first conductive pattern; a trench that penetrates the dielectric layer and exposes the first conductive pattern; a second conductive pattern that extends into the trench from a top surface of the dielectric layer and is electrically coupled to the first conductive pattern, the second conductive pattern conformally covering an inside of the trench; a first protection layer that covers the second conductive pattern on the dielectric layer and in the trench; and a second protection layer that covers the first protection layer. The first protection layer may have a cavity in the trench. The cavity may be closed by the first protection layer and the second protection layer. In the trench, a thickness of a first part of the second conductive pattern may be greater than a thickness of a second part of the second conductive pattern. The first part may be adjacent to the top surface of the dielectric layer. The second part may be adjacent to a bottom surface of the trench.

DETAILED DESCRIPTION OF EMBODIMENTS

The following will now describe a semiconductor device according to the present inventive concepts with reference to accompanying drawings.

Figure 1:
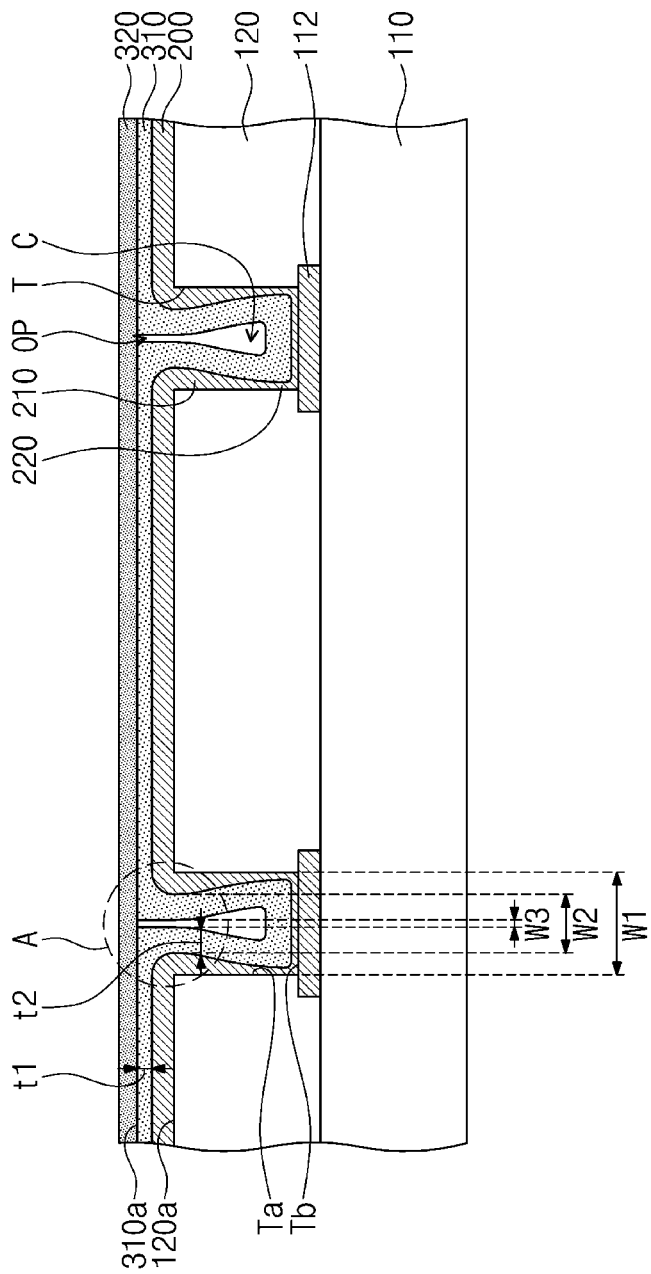
FIG. 1 illustrates a cross-sectional view showing a semiconductor device according to some embodiments of the present inventive concepts.
Figure 2:
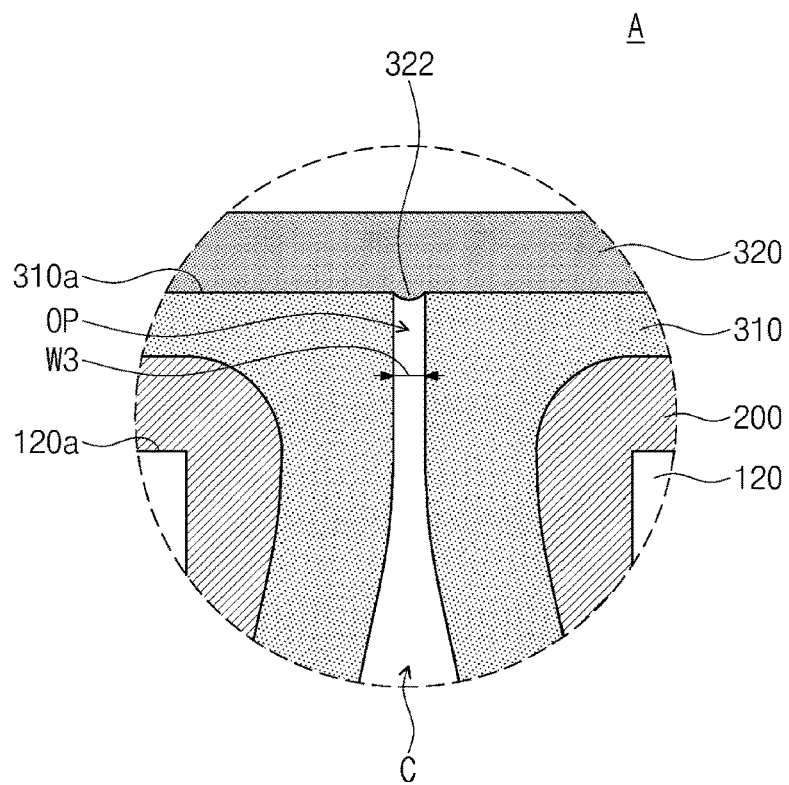
FIGS. 2 to 4 illustrate enlarged views showing section A of FIG. 1.
Figure 3:
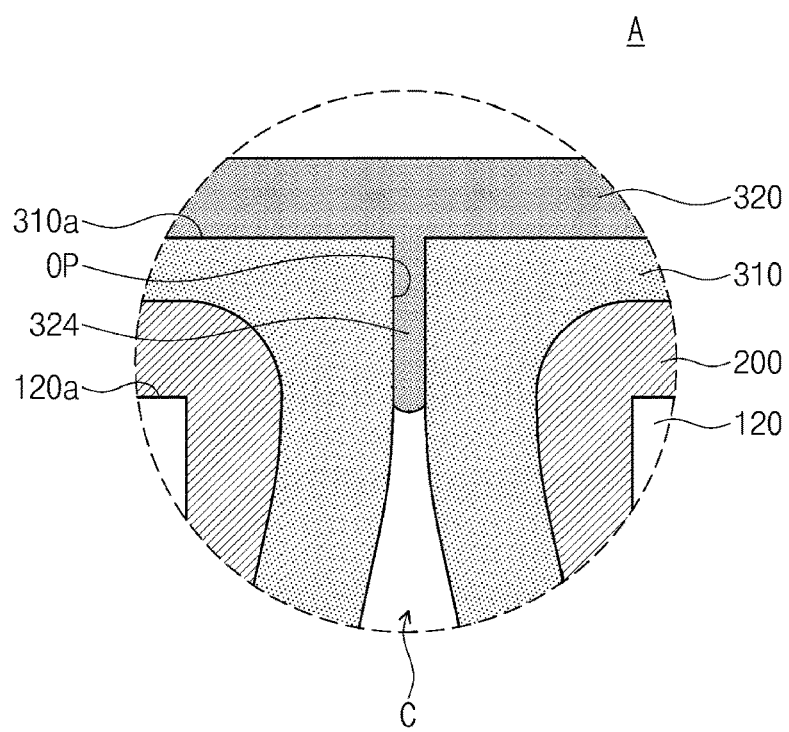

FIG. 1 illustrates a cross-sectional view showing a semiconductor device according to some embodiments of the present inventive concepts. FIGS. 2 and 3 illustrate enlarged views showing section A of FIG. 1.

Referring to FIGS. 1 and 2, a semiconductor device may include a base layer 110, a dielectric layer 120, a conductive pattern 200, a first protection layer 310, and a second protection layer 320.

The base layer 110 may be provided. In this description, the base layer 110 may be a portion of one of a redistribution layer, an interposer, and a wiring substrate on/in which wiring lines are formed. In this case, the base layer 110 may correspond to an internal wiring layer of a wiring substrate or the like, and the dielectric layer 120, the conductive pattern 200, the first protection layer 310, and the second protection layer 320 may correspond to an external wiring layer, e.g., formed on the wiring substrate. Alternatively, the base layer 110 may be a portion of one of a semiconductor substrate in which an integrated circuit is formed and a semiconductor device such as a semiconductor die. In this case, the base layer 110 may correspond to a semiconductor substrate (or wafer) having an integrated circuit, and the dielectric layer 120, the conductive pattern 200, the first protection layer 310, and the second protection layer 320 may correspond to a redistribution pattern of a semiconductor die. Dissimilarly, the base layer 110 may correspond to a device having electrical connection, a wafer or substrate in which the device is formed, or a die or chip including the device.

A first conductive pattern 112 may be provided on the base layer 110. The first conductive pattern 112 may be disposed on a top surface of the base layer 110. Alternatively, the first conductive pattern 112 may be buried in an upper portion of the base layer 110, and a top surface of the first conductive pattern 112 may be exposed on the top surface of the base layer 110. The first conductive pattern 112 may be a pad electrically coupled to a wiring pattern or an integrated circuit in the base layer 110. The first conductive pattern 112 may include or be formed of a conductive material. The first conductive pattern 112 may include or be formed of metal, for example, aluminum (Al) or copper (Cu).

As used herein, components described as being "electrically connected" are configured such that an electrical signal can be transferred from one component to the other (although such electrical signal may be attenuated in strength as it transferred and may be selectively transferred).

The dielectric layer 120 may be provided on the base layer 110. On the top surface of the base layer 110, the dielectric layer 120 may cover the first conductive pattern 112. The dielectric layer 120 may include or be formed of a dielectric material. For example, the dielectric material may include or be formed of silicon oxide (SiO), silicon nitride (SiN), or silicon oxynitride (SiON). For another example, the dielectric material may include or be formed of a dielectric polymer material, such as prepreg, ajinomoto build-up film (ABF), flame resistant 4 (FR-4), or bismaleimide triazine (BT).

The dielectric layer 120 may have a trench T. The trench T may vertically penetrate the dielectric layer 120. The trench T may extend in a direction parallel to the top surface of the base layer 110. Alternatively, the trench T may have a hole shape that vertically penetrates the dielectric layer 120. The trench T may expose the first conductive pattern 112. Therefore, the trench T may have a bottom surface Tb that corresponds to a portion of the top surface of the first conductive pattern 112. The trench T may have a width w1 of equal to or greater than about 5 μm. For example, the width W1 of the trench T may range from about 5 μm to about 10 μm.

The dielectric layer 120 may be provided thereon with the conductive pattern 200 (referred to hereinafter a second conductive pattern). The second conductive pattern 200 may conformally cover the dielectric layer 120. For example, the second conductive pattern 200 may cover a top surface 120a of the dielectric layer 120, inner side surfaces Ta of the trench T, and the bottom surface Tb of the trench T. In the trench T, the second conductive pattern 200 may be coupled to (e.g., contact) the first conductive pattern 112. The second conductive pattern 200 may have low step coverage. For example, the second conductive pattern 200 may have an irregular thickness. For example, a thickness of the second conductive pattern 200 positioned on the top surface 120a of the dielectric layer 120 may be greater than a thickness of the second conductive pattern 200 positioned in the trench T. In this case, the thickness of the second conductive pattern 200 may reach the maximum on the top surface 120a of the dielectric layer 120, and may decrease with increasing distance from the top surface 120a of the dielectric layer 120. On the inner side surfaces Ta of the trench T, the thickness of the second conductive pattern 200 may increase as approaching the top surface 120a of the dielectric layer 120 from the bottom surface Tb of the trench T. For example, on the inner side surfaces Ta of the trench T, the second conductive pattern 200 may have a larger thickness at its first part 210 adjacent to the top surface 120a of the dielectric layer 120 and may also have a smaller thickness at its second part 220 adjacent to the bottom surface Tb of the trench T. On the inner side surfaces Ta of the trench T, the second conductive pattern 200 may have its smallest thickness at a location about 15% of the depth of the trench T from the bottom surface Tb of the trench T. Alternatively, the second conductive pattern 200 may have its smallest thickness at the bottom surface Tb of the trench T. The foregoing shape of the second conductive pattern 200 may allow the trench T to have therein an internal space which is defined by the second conductive pattern 200 and whose width decreases in a direction receding from the first conductive pattern 112. The trench T may have, between its opposite inner side surfaces Ta, an interval/distance W2 equal to or greater than about 3 μm between the first parts 210. For example, between the opposite inner side surfaces Ta of the trench T, the interval/distance W2 between the first parts 210 may range from about 3 μm to about 7 μm. The second conductive pattern 200 may be a metal pattern. The second conductive pattern 200 may include or be formed of a metallic material. For example, the metallic material may include or may be aluminum (Al).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first protection layer 310 may be provided on the second conductive pattern 200. The first protection layer 310 may conformally cover the second conductive pattern 200. For example, the first protection layer 310 may cover the second conductive pattern 200 on the top surface 120a of the dielectric layer 120, the inner side surfaces Ta of the trench T, and the bottom surface Tb of the trench T. The first protection layer 310 may have an irregular thickness. For example, a thickness t1 of the first protection layer 310 positioned on the top surface 120a of the dielectric layer 120 may be less than a thickness t2 of the first protection layer 310 positioned in the trench T. The thickness of the first protection layer 310 may be uniform in the trench T. Alternatively, in the trench Ti, a thickness of the first protection layer 310 on the inner side surfaces Ta of the trench T may be greater than a thickness of the first protection layer 310 on the bottom surface Tb of the trench T. The first protection layer 310 may have a top surface 310a that is substantially flat on the top surface 120a of the dielectric layer 120. Above the trench T, the top surface 310a of the first protection layer 310 may be substantially flat, or alternatively may be concave toward the bottom surface Tb of the trench T. The first protection layer 310 may include or be formed of a dielectric material. For example, the dielectric material may include or may be tetraethoxysilane (TEOS).

Terms such as "flat," "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The first protection layer 310 may permit the trench T to have therein an internal cavity C that is surrounded by the first protection layer 310. The cavity C may have a width that decreases in an upward direction receding from the bottom surface Tb of the trench T. For example, the cavity C may have a triangular shape in a cross-sectional view. The expression "triangular shape" may mean a wide-ranging triangle that includes a triangle having three sides and a triangle having round corners. Alternatively, the cavity C may have a water-drop shape in a cross-sectional view.

An opening OP formed in the first protection layer 310 may spatially connect the cavity C to an outside of the first protection layer 310 (e.g., to an outside of the cavity C). For example, the opening OP may be a through hole, e.g., in a cross-sectional view, that extends toward the cavity C from the top surface 310a of the first protection layer 310. The opening OP may be positioned above the trench T. For example, the opening OP may be positioned at a higher level than a top of the trench T. The cavity C and the opening OP may have their inner side surfaces that are continuous with each other. The opening OP may have a width W3 that is uniform regardless of distance from the bottom surface Tb of the trench T. For example, the opening OP may have a uniform horizontal width throughout the opening OP. Alternatively, the opening OP may have a width W3 that decreases in an upward direction receding from the bottom surface Tb of the trench T.

The second protection layer 320 may be provided on the first protection layer 310. The second protection layer 320 may cover the top surface 310a of the first protection layer 310. The second protection layer 320 may cover the opening OP. In this case, as shown in FIG. 2, the second protection layer 320 may have a protrusion 322 that protrudes into the opening OP. The protrusion 322 may have a bottom surface that is convex toward the bottom surface Tb of the trench T. Alternatively, as shown in FIG. 3, the second protection layer 320 may have an extension 324 that extends into and fills the opening OP. For example, the extension 324 of the second protection layer 320 may be in contact with a topmost end of the cavity C. For example, the extension 324 of the second protection layer 320 may plug the top end of the cavity C. The extension 324 of the second protection layer 320 may have a bottom surface that is convex toward the bottom surface Tb of the trench T. The cavity C may be hermetically closed by the first and second protection layers 310 and 320. The second protection layer 320 may have a top surface that is substantially flat. The top surface of the second protection layer 320 may have flatness greater than that of the top surface 310a of the first protection layer 310. For example, the top surface of the second protection layer 320 may be flatter/smoother than the top surface 310a of the first protection layer 310. Alternatively, the top surface of the second protection layer 320 may have flatness substantially identical or similar to that of the top surface 310a of the first protection layer 310. On the top surface 120a of the dielectric layer 120, the first protection layer 310 may have a thickness less than that of the second protection layer 320. The second protection layer 320 may be formed of the same material as that of the first protection layer 310. For example, the second protection layer 320 may include or be formed of a dielectric material. For example, the dielectric material may include or may be tetraethoxysilane (TEOS). The present inventive concepts, however, are not limited thereto, and the second protection layer 320 may be formed of a dielectric material different from that of the first protection layer 310.

In general, when a protection layer is formed on a material layer having a wide deep trench, the protection layer may be formed on the material layer, and then the protection layer may undergo a planarization process (e.g., chemical mechanical polishing (CMP)) to form a substrate or a semiconductor device. In this case, a cavity may be formed in the wide deep trench, and the cavity may be opened when the planarization process is performed. In the case where an upper portion of the cavity is opened, the protection layer may be damaged when the planarization process is performed, and the protection layer may be partially non-flat at a top surface thereof.

According to some embodiments of the present inventive concepts, the first protection layer 310 may further be provided thereon with the second protection layer 320 that hermetically seals the cavity C. Therefore, the cavity C or the opening OP that is susceptible to damage (e.g., crack/chip) may not be exposed on the second protection layer 320, and a semiconductor device may be robust to external impact. As a result, the current disclosure may provide a semiconductor device having increased structural stability. Moreover, because the top surface of the second protection layer 320 has flatness greater than that of the top surface 310a of the first protection layer 310, other processes (e.g., subsequent processes) may be easily performed on the top surface of the second protection layer 320. For example, the second protection layer 320 may level an uneven/rough top surface of the first protection layer 310.

FIGS. 1 to 3 show that the opening OP is formed in the first protection layer 310, but the present inventive concepts are not limited thereto.

Figure 4:
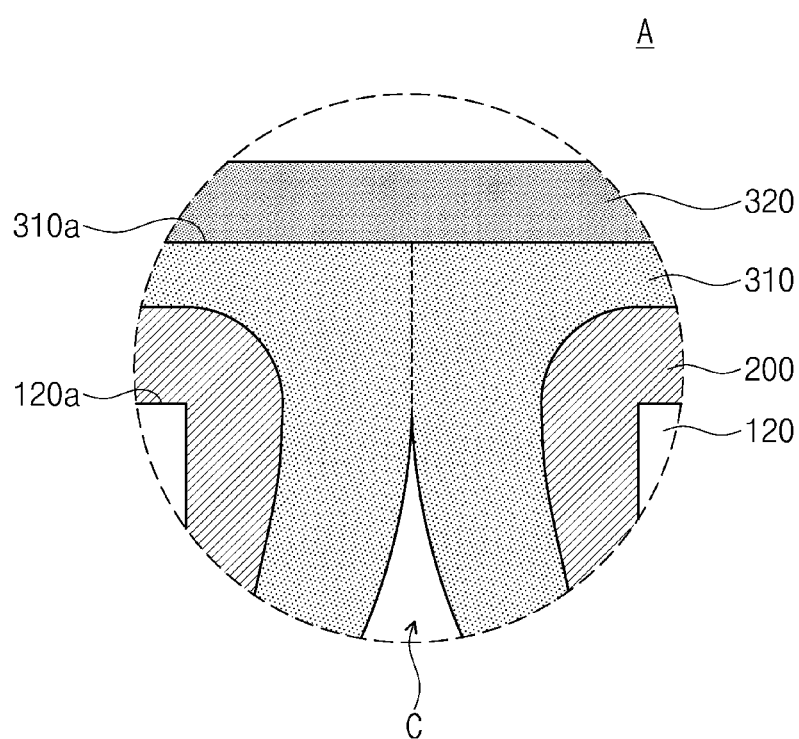

FIG. 4 illustrates an enlarged view of section A depicted in FIG. 1, showing a different embodiment from that of FIGS. 2 and 3.

Referring to FIGS. 1 and 4, the opening (see OP of FIGS. 1 to 3) may not be provided in the first protection layer 310. The cavity C may be positioned in an inside of the first protection layer 310. For example, the first protection layer 310 may have portions disposed on the inner side surfaces Ta of the trench T, and the portions of the first protection layer 310 disposed on upper portions of opposite side surfaces of the trench T may be in contact with each other. For example, the first protection layer 310 may hermetically seal the cavity C. The cavity C may have a width that decreases in an upward direction approaching the second protection layer 320. The cavity C may have a water-drop shape in a cross-sectional view. The top surface 310a of the first protection layer 310 may be substantially flat.

Figure 5:
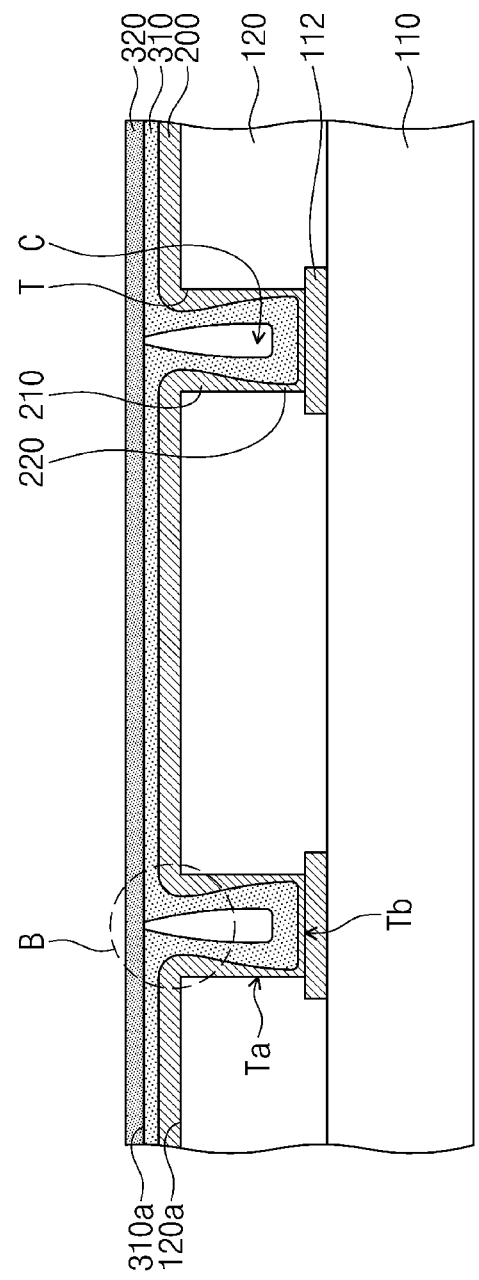
FIG. 5 illustrates a cross-sectional view showing a semiconductor device according to some embodiments of the present inventive concepts.
Figure 6:
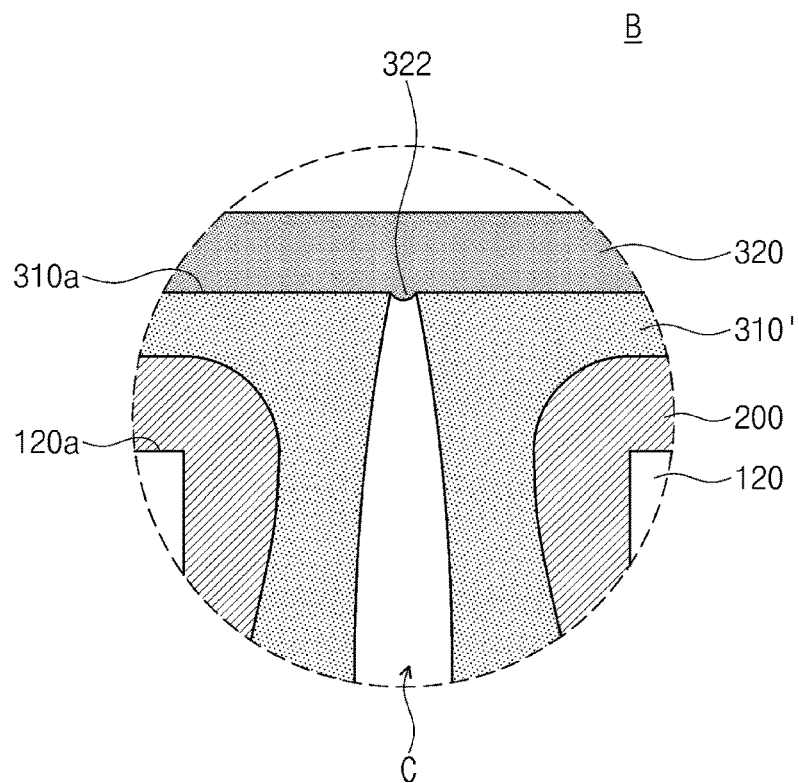
FIGS. 6 and 7 illustrate enlarged views showing section B of FIG. 5.
Figure 7:
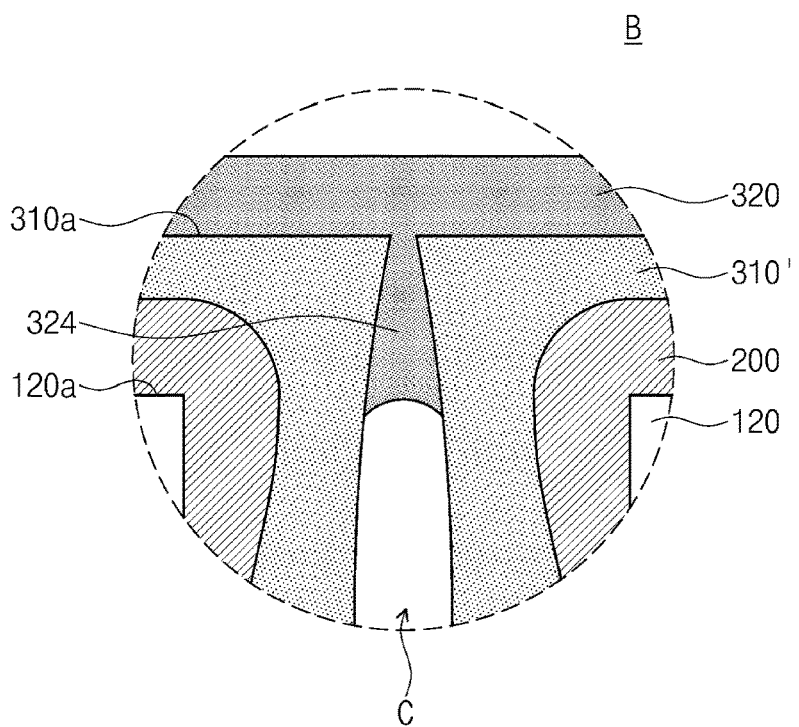

FIG. 5 illustrates a cross-sectional view showing a semiconductor device according to some embodiments of the present inventive concepts. FIGS. 6 and 7 illustrate enlarged views showing section B of FIG. 5.

Referring to FIGS. 5 and 6, the opening (see OP of FIGS. 1 to 3) may not be provided in a first protection layer 310'. The cavity C may be positioned in an inside of the first protection layer 310'. In this case, the first protection layer 310' may not hermetically seal the cavity C. For example, the cavity C may be exposed on a top surface 310a of the first protection layer 310', and may be spatially connected to an outside of the first protection layer 310' (e.g., to an outside of the cavity C).

The second protection layer 320 may be provided on the first protection layer 310'. The second protection layer 320 may cover the top surface 310a of the first protection layer 310'. The second protection layer 320 may cover the cavity C. In this case, as shown in FIG. 6, the second protection layer 320 may have a protrusion 322 that protrudes into the cavity C. The protrusion 322 may have a bottom surface that is convex toward the bottom surface Tb of the trench T. Alternatively, as shown in FIG. 7, the second protection layer 320 may have an extension 324 that protrudes into the cavity C and fills an upper portion of the cavity C. The extension 324 of the second protection layer 320 may have a bottom surface that is concave toward the top surface of the second protection layer 320. The cavity C may be hermetically closed by the first and second protection layers 310 and 320.

Figure 8:
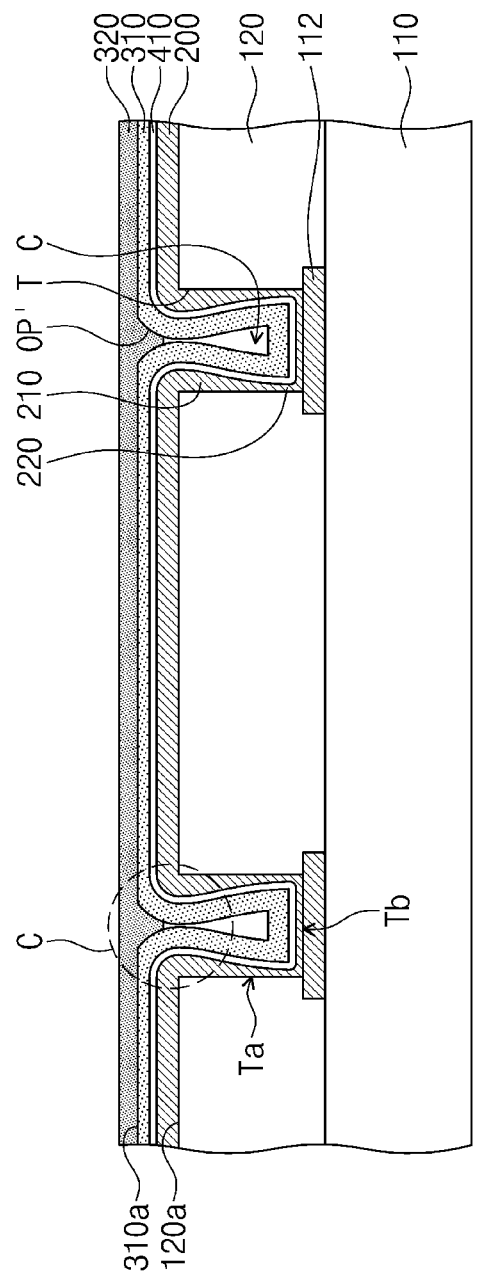
FIG. 8 illustrates a cross-sectional view showing a semiconductor device according to some embodiments of the present inventive concepts.
Figure 9:
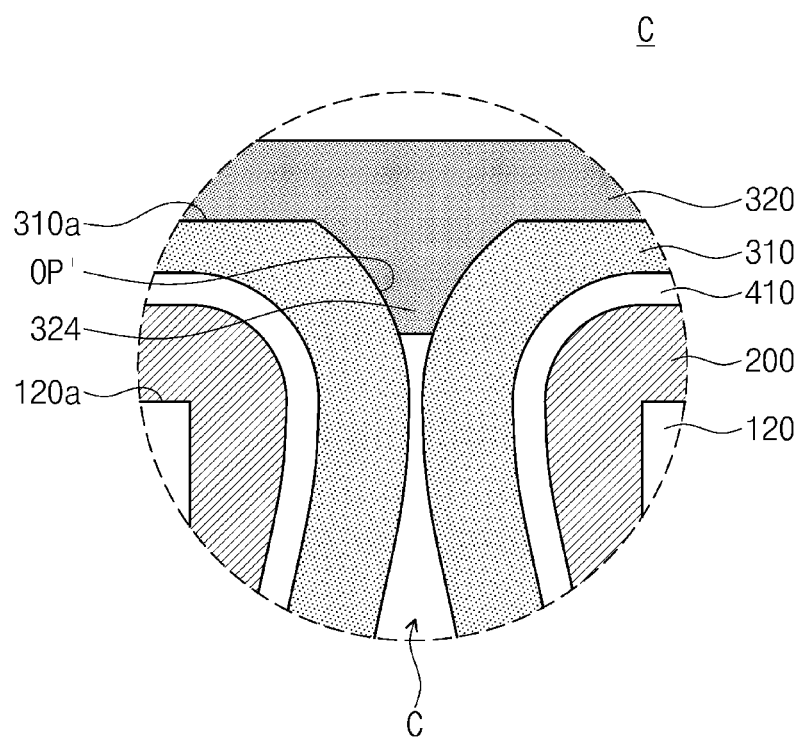
FIG. 9 illustrates an enlarged view showing section C of FIG. 8.

FIG. 8 illustrates a cross-sectional view showing a semiconductor device according to some embodiments of the present inventive concepts. FIG. 9 illustrates an enlarged view showing section C of FIG. 8.

Referring to FIGS. 8 and 9, a first intermediate layer 410 may be interposed between the second conductive pattern 200 and the first protection layer 310. The first intermediate layer 410 may conformally cover the second conductive pattern 200. For example, the first intermediate layer 410 may cover the second conductive pattern 200 on the top surface 120a of the dielectric layer 120, the inner side surfaces Ta of the trench T, and the bottom surface Tb of the trench T. The first intermediate layer 410 may have a substantially uniform thickness. The first intermediate layer 410 may be formed of the same material as that of the first protection layer 310. For example, the first intermediate layer 410 may include or be formed of a dielectric material. For example, the dielectric material may include or may be tetraethoxysilane (TEOS). The first intermediate layer 410 may have a crystallinity different from those of the first and second protection layers 310 and 320. For example, the first intermediate layer 410 may be formed by a process different from that used for forming the first and second protection layers 310 and 320. The first and second protection layers 310 and 320 may be formed by using plasma enhanced chemical vapor deposition (PECVD), and the first intermediate layer 410 may be formed by using high density plasma chemical vapor deposition (HDP-CVD). Therefore, the first intermediate layer 410 may be denser than the first and second protection layers 310 and 320. For example, the first intermediate layer 410 may have a density higher than a density of the first protection layer 310 and higher than a density the second protection layer 320. When a semiconductor device is fabricated, the highly dense first intermediate layer 410 may facilitate the formation of the first protection layer 310. This will be further discussed in detail below in the following method of fabricating a semiconductor device. Alternatively, the first intermediate layer 410 may be formed of a different material from that of the first protection layer 310.

The first protection layer 310 may be provided on the first intermediate layer 410. The first protection layer 310 may conformally cover the first intermediate layer 410. For example, the first protection layer 310 may cover the first intermediate layer 410 on the top surface 120a of the dielectric layer 120, the inner side surfaces Ta of the trench T, and the bottom surface Tb of the trench T. The first protection layer 310 may have an irregular thickness. For example, a thickness of the first protection layer 310 positioned on the top surface 120a of the dielectric layer 120 may be less than a thickness of the first protection layer 310 positioned in the trench T. The first protection layer 310 may include or be formed of a dielectric material. For example, the dielectric material may include or may be tetraethoxysilane (TEOS).

The first protection layer 310 may permit the trench T to have therein an internal cavity C that is surrounded by the first protection layer 310. The cavity C may have a width that decreases with increasing distance from the bottom surface Tb of the trench T. For example, the width of the cavity C may decrease in an upward direction vertically receding from the bottom surface Tb of the trench T.

An opening OP' formed in the first protection layer 310 may spatially connect the cavity C to an outside of the first protection layer 310 (e.g., to an outside of the cavity C). For example, the opening OP' may be a through hole that vertically extends toward the cavity C from a vertical level at which the top surface 310a of the first protection layer 310 is disposed. The opening OP' may be positioned above the trench T (e.g., at a higher vertical level than the trench T is positioned). The opening OP' may have a width that decreases with increasing distance from the bottom surface Tb of the trench T. For example, the width of the opening OP' may decrease in an upward direction vertically receding from the bottom surface Tb of the trench T.

The second protection layer 320 may be provided on the first protection layer 310. The second protection layer 320 may cover the top surface 310a of the first protection layer 310. The second protection layer 320 may cover the opening OP'. In this case, the second protection layer 320 may have a protrusion 322 that protrudes into the opening OP'. The protrusion 322 may have a bottom surface that is convex toward the bottom surface Tb of the trench T. The second protection layer 320 may be formed of the same material as that of the first protection layer 310. For example, the second protection layer 320 may include or be formed of a dielectric material. For example, the dielectric material may include or may be tetraethoxysilane (TEOS). The present inventive concepts, however, are not limited thereto, and the second protection layer 320 may be formed of a dielectric material different from that of the first protection layer 310.

Figure 10:
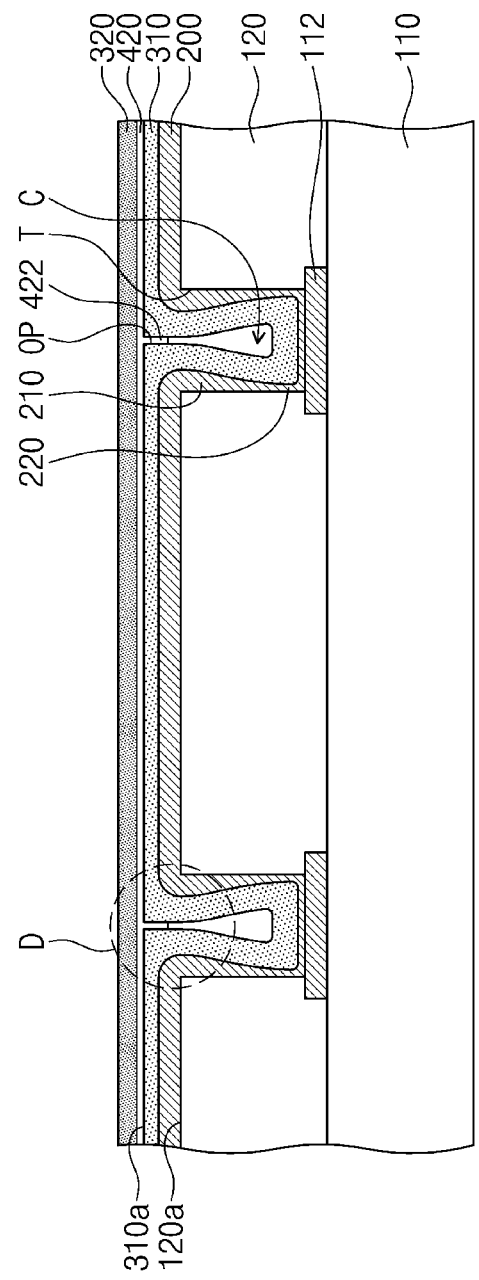
FIG. 10 illustrates a cross-sectional view showing a semiconductor device according to some embodiments of the present inventive concepts.
Figure 11:
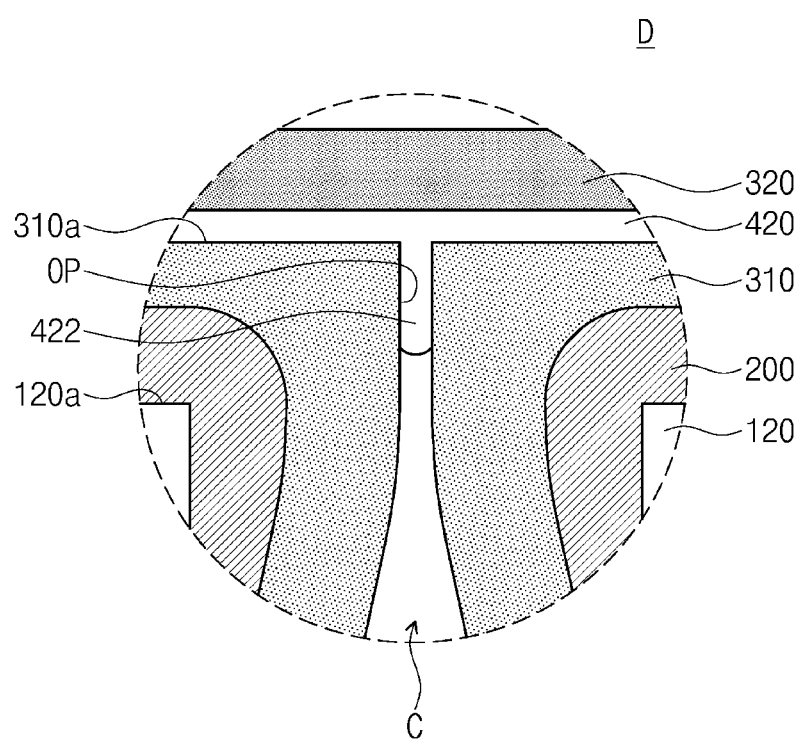
FIG. 11 illustrates an enlarged view showing section D of FIG. 10.

FIG. 10 illustrates a cross-sectional view showing a semiconductor device according to some embodiments of the present inventive concepts. FIG. 11 illustrates an enlarged view showing section D of FIG. 10.

Referring to FIGS. 10 and 11, the first protection layer 310 may be provided on the second conductive pattern 200. The first protection layer 310 may conformally cover the second conductive pattern 200. For example, the first protection layer 310 may cover the second conductive pattern 200 on the top surface 120a of the dielectric layer 120, the inner side surfaces Ta of the trench T, and the bottom surface Tb of the trench T. The first protection layer 310 may have a top surface 310a that is substantially flat on the top surface 120a of the dielectric layer 120. Above the trench T, the top surface 310a of the first protection layer 310 may be substantially flat, or alternatively may be concave toward the bottom surface Tb of the trench T. The first protection layer 310 may include or be formed of a dielectric material. For example, the dielectric material may include or may be tetraethoxysilane (TEOS).

The first protection layer 310 may permit the trench T to have therein an internal cavity C that is surrounded by the first protection layer 310. The cavity C may have a width that decreases with increasing distance from the bottom surface Tb of the trench T. For example, the width of the cavity C may decrease in an upward direction vertically receding from the bottom surface Tb of the trench T. For example, the cavity C may have a triangular shape in a cross-sectional view.

An opening OP formed in the first protection layer 310 may spatially connect the cavity C to an outside of the first protection layer 310 (e.g., to an outside of the cavity C). For example, the opening OP may be a through hole that extends toward the cavity C from the top surface 310a of the first protection layer 310. For example, the opening OP may extend from an uppermost part of the first protection layer 310 and may be directly connected to the cavity. The opening OP may have a width that is uniform regardless of distance from the bottom surface Tb of the trench T. For example, the width of the opening OP in a horizontal direction may be the same throughout the opening OP.

A second intermediate layer 420 may be interposed between the first protection layer 310 and the second protection layer 320. The second intermediate layer 420 may cover the top surface 310a of the first protection layer 310. The second intermediate layer 420 may have a substantially uniform thickness. The second intermediate layer 420 may be formed of the same material as that of the second protection layer 320. For example, the second intermediate layer 420 may include or be formed of a dielectric material. For example, the dielectric material may include or may be tetraethoxysilane (TEOS). The second intermediate layer 420 may have crystallinity different from those of the first and second protection layers 310 and 320. For example, the second intermediate layer 420 may be formed by a process different from that used for forming the first and second protection layers 310 and 320. The first and second protection layers 310 and 320 may be formed by using plasma enhanced chemical vapor deposition (PECVD), and the second intermediate layer 420 may be formed by using high density plasma chemical vapor deposition (HDP-CVD). Therefore, the second intermediate layer 420 may be denser than the first and second protection layers 310 and 320. For example, the second intermediate layer 420 may have a density higher than a density of the first protection layer 310 and higher than a density the second protection layer 320. When a semiconductor device is fabricated, the highly dense second intermediate layer 420 may facilitate the formation of the second protection layer 320. This will be further discussed in detail below in the following method of fabricating a semiconductor device. Alternatively, the second intermediate layer 420 may be formed of a different material from that of the second protection layer 320.

The second intermediate layer 420 may have a protrusion 422 that protrudes into the opening OP. The protrusion 422 may have a bottom surface that is convex toward the bottom surface Tb of the trench T. The cavity C may be hermetically closed by the first protection layer 310 and the second intermediate layer 420.

The second protection layer 320 may be provided on the second intermediate layer 420. The second protection layer 320 may cover a top surface of the second intermediate layer 420. The second protection layer 320 may be formed of the same material as that of the first protection layer 310. For example, the second protection layer 320 may include or be formed of a dielectric material. For example, the dielectric material may include or may be tetraethoxysilane (TEOS). The present inventive concepts, however, are not limited thereto, and the second protection layer 320 may be formed of a dielectric material different from that of the first protection layer 310.

Figure 12:
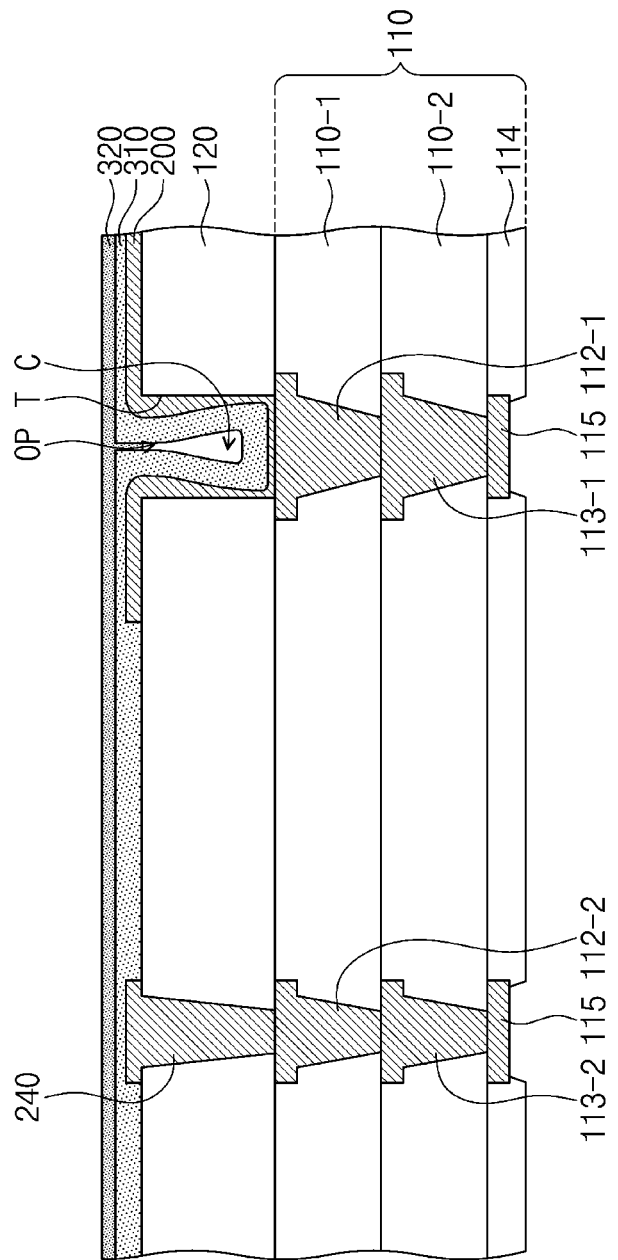
FIGS. 12 to 14 illustrate cross-sectional views showing a semiconductor device according to some embodiments of the present inventive concepts.

FIG. 12 illustrates a cross-sectional view showing a semiconductor device according to some embodiments of the present inventive concepts.

Referring to FIG. 12, the semiconductor device may be or may include a substrate such as a semiconductor substrate, a redistribution substrate, or an interposer substrate.

A base layer 110 may be a portion of one of a redistribution layer, an interposer, and a wiring substrate on/in which wiring lines are formed. For example, the base layer 110 may include a plurality of redistribution layers 110-1 and 110-2 that are stacked on each other. For example, the redistribution layers 110-1 and 110-2 may include a first redistribution layer 110-1 and a second redistribution layer 110-2 below the first redistribution layer 110-1.

The first redistribution layer 110-1 may include a photo-imageable dielectric (PID). Alternatively, the first redistribution layer 110-1 may include a dielectric polymer material, such as prepreg, ajinomoto build-up film (ABF), flame resistant 4 (FR-4), or bismaleimide triazine (BT).

The first redistribution layer 110-1 may include a first upper wiring pattern 112-1 and a second upper wiring pattern 112-2 that are provided in the first redistribution layer 110-1. The first and second upper wiring patterns 112-1 and 112-2 may each have a damascene structure. For example, each of the first and second upper wiring patterns 112-1 and 112-2 may have a tail part that vertically penetrates the first redistribution layer 110-1 and a head part on the tail part. For example, the tail part and the head part may be integrally formed as one body in the same photolithography process. The head part of the first upper wiring pattern 112-1 may correspond to the first conductive pattern (see 112 of FIG. 1) discussed with reference to FIGS. 1 to 3. The first upper wiring pattern 112-1 may have a width greater than that of the second upper wiring pattern 112-2.

The second redistribution layer 110-2 may be provided below the first redistribution layer 110-1. The second redistribution layer 110-2 may include a photo-imageable dielectric (PID). Alternatively, the second redistribution layer 110-2 may include a dielectric polymer material, such as prepreg, ajinomoto build-up film (ABF), flame resistant 4 (FR-4), or bismaleimide triazine (BT).

The second redistribution layer 110-2 may include a first lower wiring pattern 113-1 and a second lower wiring pattern 113-2 that are provided in the second redistribution layer 110-2. The first and second lower wiring patterns 113-1 and 113-2 may each have a damascene structure. For example, each of the first and second lower wiring patterns 113-1 and 113-2 may have a tail part that vertically penetrates the second redistribution layer 110-2 and a head part on the tail part. For example, the tail part and the head part may be integrally formed as one body in the same photolithography process. The first lower wiring pattern 113-1 may contact and/or be electrically connected to the first upper wiring pattern 112-1. The second lower wiring pattern 113-2 may contact and/or be electrically connected to the second upper wiring pattern 112-2. The first lower wiring pattern 113-1 may have a width greater than that of the second lower wiring pattern 113-2.

The second redistribution layer 110-2 may have substrate pads 115 provided on a bottom surface thereof. The substrate pads 115 may contact and/or be electrically connected to the first and second lower wiring patterns 113-1 and 113-2.

The second redistribution layer 110-2 may be provided thereunder with a passivation layer 114 that covers a bottom surface of the second redistribution layer 110-2. The passivation layer 114 may expose the substrate pads 115 while covering the bottom surface of the second redistribution layer 110-2.

FIG. 12 shows the base layer 110 having two redistribution layers 110-1 and 110-2, but the present inventive concepts are not limited thereto. The base layer 110 may have redistribution layers whose number is variously changed if needed.

A dielectric layer 120 may be provided on the first redistribution layer 110-1. The dielectric layer 120 may cover the first redistribution layer 110-1. The dielectric layer 120 may have a trench T that exposes the first upper wiring pattern 112-1.

A second conductive pattern 200 and a third conductive pattern 240 may be disposed on the dielectric layer 120. The second conductive pattern 200 may extend into the trench T from a top surface of the dielectric layer 120 and may contact and/or be electrically coupled to the first upper wiring pattern 112-1. In this case, the second conductive pattern 200 may conformally cover inner sidewalls and bottom surfaces of the trench T. The third conductive pattern 240 may penetrate the dielectric layer 120 and may contact and/or be electrically coupled to the second upper wiring pattern 112-2. The third conductive pattern 240 may have a damascene structure. For example, the third conductive pattern 240 may have a tail part that vertically penetrates the dielectric layer 120 and may also have, on the tail part, a head part that covers the top surface of the dielectric layer 120. For example, the tail part and the head part may be integrally formed as one body in the same photolithography process.

A first protection layer 310 may be provided on the second conductive pattern 200. On the top surface of the dielectric layer 120, the first protection layer 310 may cover the second conductive pattern 200 and the third conductive pattern 240. In the trench T, the first protection layer 310 may conformally cover the second conductive pattern 200. The first protection layer 310 may permit the trench T to have therein an internal cavity C that is surrounded by the first protection layer 310. An opening OP formed in the first protection layer 310 may spatially connect the cavity C to an outside of the first protection layer 310 (e.g., to an outside of the cavity C).

A second protection layer 320 may be provided on the first protection layer 310. The second protection layer 320 may cover a top surface of the first protection layer 310. The second protection layer 320 may cover the opening OP. The cavity C may be hermetically closed by the first and second protection layers 310 and 320.

Figure 13:
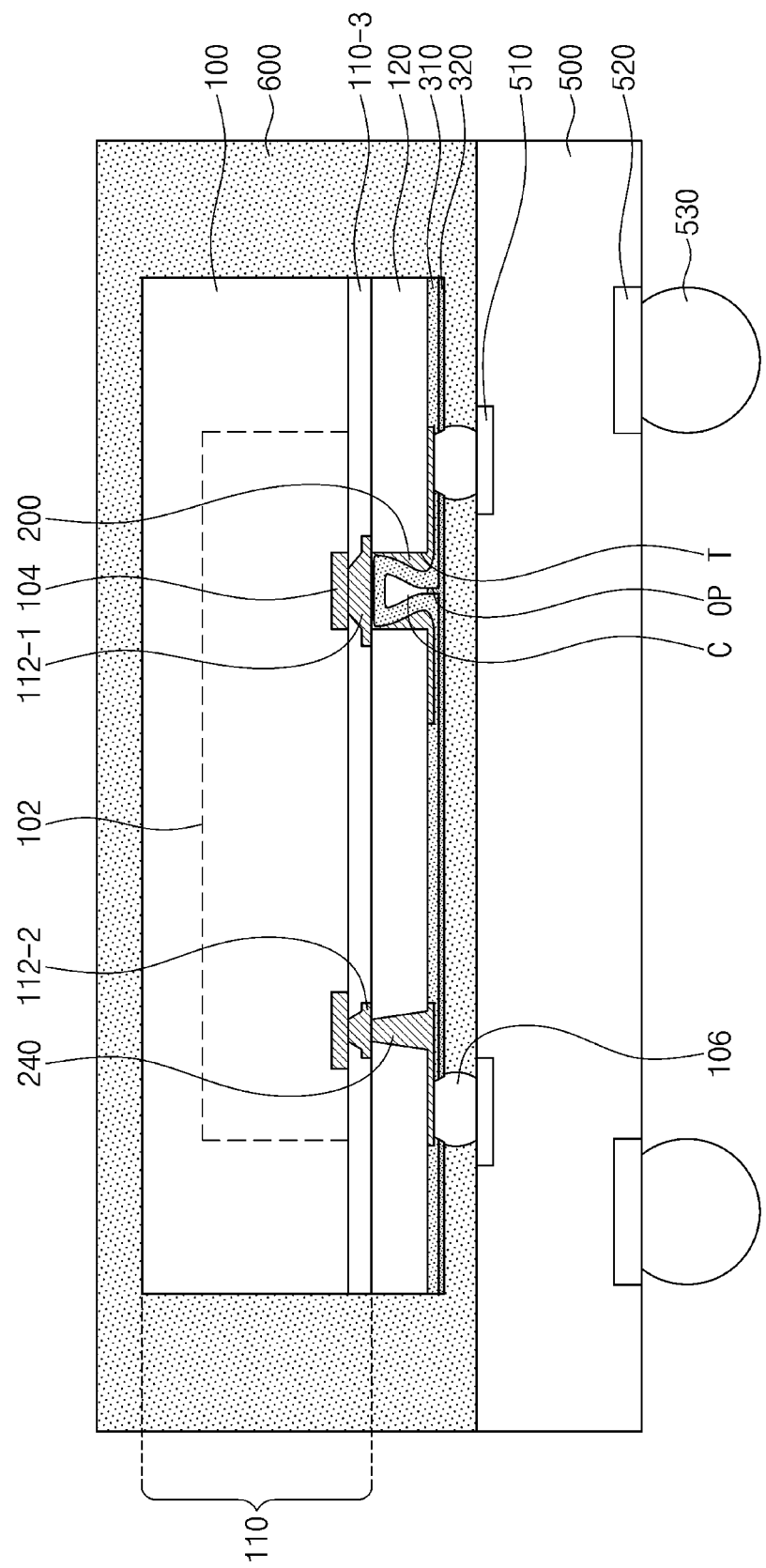

FIG. 13 illustrates a cross-sectional view showing a semiconductor package.

Referring to FIG. 13, the semiconductor device may be a semiconductor package including a semiconductor chip.

A base layer 110 may include a semiconductor chip 100 having an integrated circuit 102 formed therein and a wiring layer 110-3 electrically connected to the semiconductor chip 100. The semiconductor chip 100 may include a semiconductor substrate such as a silicon wafer. The semiconductor chip 100 may have a bottom surface or an active surface. The integrated circuit 102 may be formed in a lower portion of the semiconductor chip 100. The semiconductor chip 100 may have chip pads 104 provided on the bottom surface thereof. The chip pads 104 may be electrically connected to the integrated circuit 102 of the semiconductor chip 100.

The wiring layer 110-3 may be provided on the bottom surface of the semiconductor chip 100. The wiring layer 110-3 may include a first wiring pattern 112-1 and a second wiring pattern 112-2 that are provided in the wiring layer 110-3. The first and second wiring patterns 112-1 and 112-2 may each have a damascene structure. For example, each of the first and second wiring patterns 112-1 and 112-2 may have a tail part that vertically penetrates the wiring layer 110-3 and a head part below the tail part. For example, the tail part and the head part may be integrally formed as one body in the same photolithography process. The first and second wiring patterns 112-1 and 112-2 may contact and/or be electrically connected to the chip pads 104. The first wiring pattern 112-1 may have a width greater than that of the second wiring pattern 112-2, e.g., in a horizontal direction.

A dielectric layer 120 may be provided below the wiring layer 110-3. The dielectric layer 120 may cover the wiring layer 110-3. For example, the dielectric layer 120 may contact the bottom surface of the wiring layer 110-3. The dielectric layer 120 may have a trench T that exposes the first wiring pattern 112-1.

A second conductive pattern 200 and third conductive pattern 240 may be disposed below and/or in the same level as the dielectric layer 120. For example, the second conductive pattern 200 may extend into the trench T from a bottom surface of the dielectric layer 120 and may contact and/or be electrically coupled to the first wiring pattern 112-1. In this case, the second conductive pattern 200 may conformally cover inner sidewalls and bottom surfaces of the trench T. The third conductive pattern 240 may penetrate the dielectric layer 120 and may contact and/or be electrically coupled to the second wiring pattern 112-2.

A first protection layer 310 may be provided below the second conductive pattern 200. On the bottom surface of the dielectric layer 120, the first protection layer 310 may cover the second and third conductive patterns 200 and 240. For example, the first protection layer 310 may contact the second third conductive patterns 200 and 240. In the trench T, the first protection layer 310 may conformally cover the second conductive pattern 200. The first protection layer 310 may permit the trench T to have therein an internal cavity C that is surrounded by the first protection layer 310. An opening OP formed in the first protection layer 310 may spatially connect the cavity C to an outside of the first protection layer 310 (e.g., to an outside of the cavity C).

A second protection layer 320 may be provided on the first protection layer 310. The second protection layer 320 may cover a bottom surface of the first protection layer 310. The second protection layer 320 may cover the opening OP. The cavity C may be hermetically closed by the first and second protection layers 310 and 320.

A package substrate 500 may be provided. The package substrate 500 may include or may be a printed circuit board (PCB) having a signal pattern on a top surface thereof. Alternatively, the package substrate 500 may have a structure in which at least one dielectric layer and at least one wiring layer are alternately stacked. For example, two or more dielectric layers and two or more wiring layers may be alternately stacked in the package substrate 500. The package substrate 500 may have first substrate pads 510 disposed on a top surface thereof.

External terminals 530 may be disposed below the package substrate 500. For example, the external terminals 530 may be disposed on second substrate pads 520 provided on a bottom surface of the package substrate 500. The external terminals 530 may include or may be solder balls or solder bumps, and depending on type of the external terminals 530, the semiconductor package may be provided in the shape of one of a ball grid array (BGA) type, a fine ball-grid array (FBGA) type, and a land grid array (LGA) type.

The semiconductor chip 100 may be mounted on the package substrate 500. The semiconductor chip 100 may be mounted in a flip-chip manner For example, conductive bumps/terminals built on or attached on a surface of the semiconductor chip 100 may face and be electrically connected to conductive pads of an upper surface of the package substrate 500. For example, chip terminals 106 may be provided below the second protection layer 320. The chip terminals 106 may penetrate the second protection layer 320 and the first protection layer 310, and may contact and/or be electrically coupled to the second conductive pattern 200 and the third conductive pattern 240. The chip terminals 106 may contact and/or be electrically coupled to the first substrate pads 510 of the package substrate 500. The semiconductor chip 100 may be electrically connected to the package substrate 500 through the wiring layer 110-3, the second conductive pattern 200, the third conductive pattern 240, and the chip terminals 106.

A molding layer 600 may be disposed on the top surface of the package substrate 500. The molding layer 600 may cover the package substrate 500 and may surround the semiconductor chip 100. The molding layer 600 may include or be formed of a dielectric polymer material. For example, the molding layer 600 may include or be formed of an epoxy molding compound (EMC).

Figure 14:
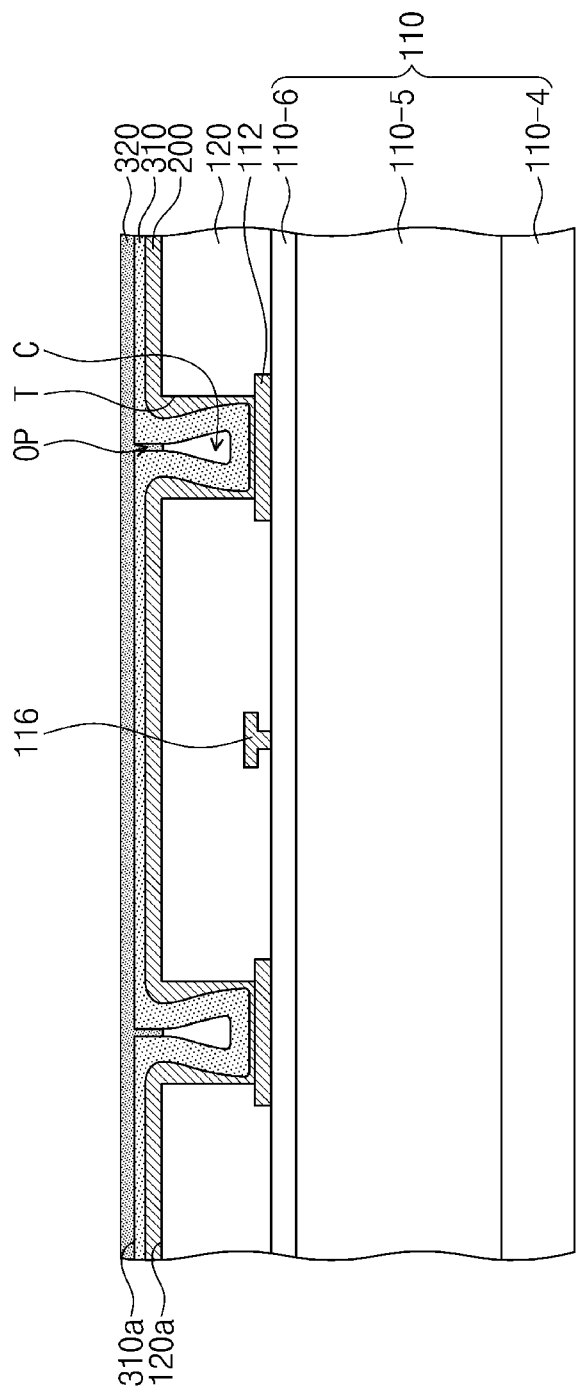

FIG. 14 illustrates a cross-sectional view showing a semiconductor device according to some embodiments of the present inventive concepts.

Referring to FIG. 14, the semiconductor device may be a semiconductor die.

A base layer 110 may have a top surface and a bottom surface that are opposite to each other. The base layer 110 may have either a circuit pattern formed on its top surface or chips mounted on its top surface. The base layer 110 may include a semiconductor substrate. For example, the base layer 110 may include a first semiconductor layer 110-4 and an epitaxial layer on the first semiconductor layer 110-4. The first semiconductor layer 110-4 may include or be formed of silicon carbide (SiC). The epitaxial layer may have semiconductor layers having a hetero junction structure. For example, the epitaxial layer may include a second semiconductor layer 110-5 and a third semiconductor layer 110-6. The second semiconductor layer 110-5 may include or be formed of gallium nitride (GaN). The third semiconductor layer 110-6 may include or be formed of aluminum gallium nitride (AlGaN). A two-dimensional electron gas (2-DEG) region may be formed due to the hetero junction structure of the second and third semiconductor layers 110-5 and 110-6.

A transistor may be provided on a top surface of the base layer 110. For example, source/drain electrodes 112 and a gate electrode 116 may be disposed on the third semiconductor layer 110-6. The source/drain electrodes 112 may correspond to the first conductive pattern 112 discussed with reference to FIGS. 1 to 3. In a plan view, the gate electrode 116 may be disposed between the source/drain electrodes 112. A difference in voltage between the source/drain electrodes 112 may move charges in the two-dimensional electron gas (2-DEG) region between the second and third semiconductor layers 110-5 and 110-6.

A dielectric layer 120 may be provided on the third semiconductor layer 110-6. On a top surface of the third semiconductor layer 110-6, the dielectric layer 120 may cover the source/drain electrodes 112 and the gate electrode 116. The dielectric layer 120 may include or be formed of a dielectric material.

The dielectric layer 120 may have a trench T. For example, the trench T may be formed in the dielectric layer 120. The trench T may vertically penetrate the dielectric layer 120. The trench T may expose the source/drain electrode 112.

A second conductive pattern 200 may be disposed on the dielectric layer 120. The second conductive pattern 200 may conformally cover the dielectric layer 120. For example, the second conductive pattern 200 may cover a top surface 120a of the dielectric layer 120, inner side surfaces of the trench T, and a bottom surface of the trench T. In the trench T, the second conductive pattern 200 may contact and/or be electrically coupled to the source/drain electrode 112. On the inner side surfaces of the trench T, the second conductive pattern 200 may have a thickness in a horizontal direction that increases in a direction approaching the top surface 120a of the dielectric layer 120 from the bottom surface of the trench T. The second conductive pattern 200 may include or be formed of a metallic material. For example, the metallic material may include or be formed of aluminum (Al).

A first protection layer 310 may be provided on the second conductive pattern 200. The first protection layer 310 may conformally cover the second conductive pattern 200. For example, the first protection layer 310 may cover the second conductive pattern 200 on the top surface 120a of the dielectric layer 120, the inner side surfaces of the trench T, and the bottom surface of the trench T. The first protection layer 310 may have a top surface 310a that is substantially flat on the top surface 120a of the dielectric layer 120. The first protection layer 310 may include or be formed of a dielectric material. For example, the dielectric material may include or be formed of tetraethoxysilane (TEOS).

The first protection layer 310 may permit the trench T to have therein an internal cavity C that is surrounded by the first protection layer 310. The cavity C may have a width that decreases in an upward direction vertically receding from the bottom surface of the trench T.

An opening OP formed in the first protection layer 310 may spatially connect the cavity C to an outside of the first protection layer 310 (e.g., to an outside of the cavity C). For example, the opening OP may be a through hole that extends toward the cavity C from a top surface 310a of the first protection layer 310. The opening OP may be positioned above the trench T. For example, a vertical level of the opening OP may be higher than a vertical level of a top end of the trench T.

A second protection layer 320 may be provided on the first protection layer 310. The second protection layer 320 may cover the top surface 310a of the first protection layer 310. The second protection layer 320 may cover the opening OP. The cavity C may be hermetically closed by the first and second protection layers 310 and 320. The second protection layer 320 may have a top surface that is substantially flat. On the top surface 120a of the dielectric layer 120, the first protection layer 310 may have a thickness less than that of the second protection layer 320. The second protection layer 320 may be formed of the same material as that of the first protection layer 310. For example, the second protection layer 320 may include or be formed of a dielectric material. For example, the dielectric material may include or may be tetraethoxysilane (TEOS).

FIGS. 12 to 14 exemplarily show embodiments of the base layer 110, and the present inventive concepts are not limited thereto.

FIGS. 15 to 23 illustrate cross-sectional views showing a method of fabricating a semiconductor device according to some embodiments of the present inventive concepts.

Figure 15:
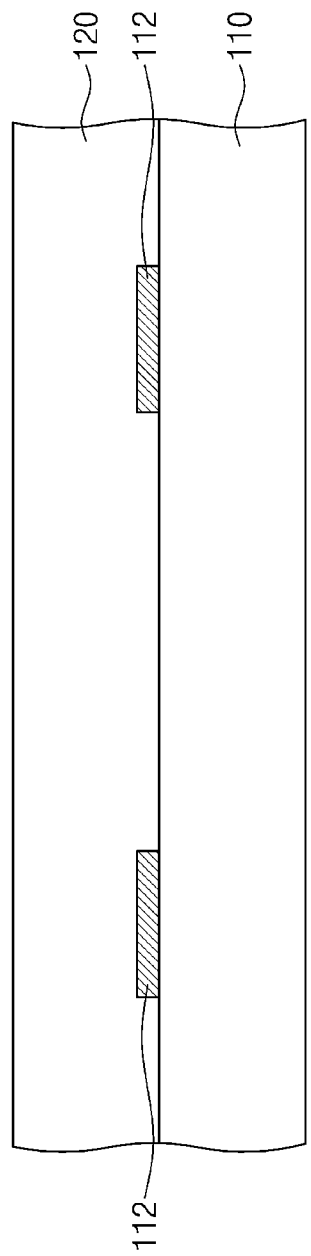
FIGS. 15 to 23 illustrate cross-sectional views showing a method of fabricating a semiconductor device according to some embodiments of the present inventive concepts.

Referring to FIG. 15, a base layer 110 may be provided. The base layer 110 may be a portion of one of a redistribution layer, an interposer, and a wiring substrate on/in which wiring lines are formed. For example, the base layer 110 may correspond to an internal wiring layer of a wiring substrate or the like. Alternatively, the base layer 110 may be a portion of one of a semiconductor substrate on which an integrated circuit is formed and a semiconductor device such as a semiconductor die. For example, the base layer 110 may correspond to a semiconductor substrate (or wafer) having an integrated circuit. Dissimilarly, the base layer 110 may correspond to a device having electrical connection, a wafer or substrate on which the device is formed, or a die or chip including the device.

A first conductive pattern 112 may be formed on the base layer 110. The first conductive pattern 112 may be formed on a top surface of the base layer 110. The first conductive pattern 112 may be a pad electrically coupled to a wiring pattern or an integrated circuit in the base layer 110. The first conductive pattern 112 may include or be formed of a conductive material. For example, the first conductive pattern 112 may include or be formed of metal, such as copper (Cu).

A dielectric layer 120 may be formed on the base layer 110. For example, the dielectric layer 120 may be formed by coating or depositing on the top surface of the base layer 110 a dielectric material to cover the first conductive pattern 112, and then curing the dielectric material. The curing of the dielectric material may be omitted if needed. The dielectric material may include or may be silicon oxide (SiO), silicon nitride (SiN), or silicon oxynitride (SiON). Alternatively, the dielectric material may include or may be a dielectric polymer material, such as prepreg, ajinomoto build-up film (ABF), flame resistant 4 (FR-4), or bismaleimide triazine (BT).

Figure 16:
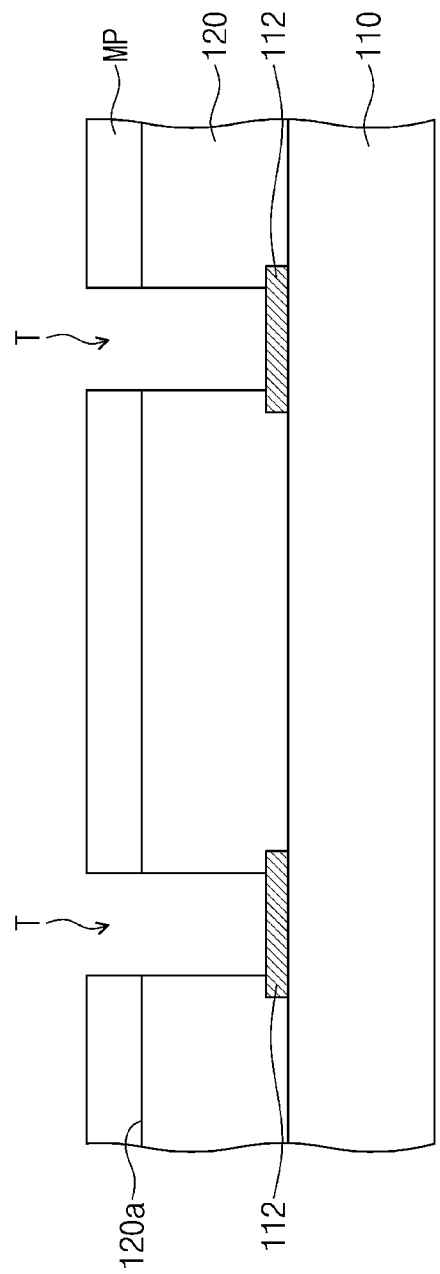

Referring to FIG. 16, a trench T may be formed in the dielectric layer 120. For example, a mask pattern MP may be formed on a top surface 120a of the dielectric layer 120. An etching process may be performed in which the mask pattern MP is used as an etching mask to etch the dielectric layer 120. The trench T may partially expose a top surface of the first conductive pattern 112. The trench T may be formed to have a width equal to or greater than about 5 μm.

Afterwards, the mask pattern MP may be removed.

Figure 17:
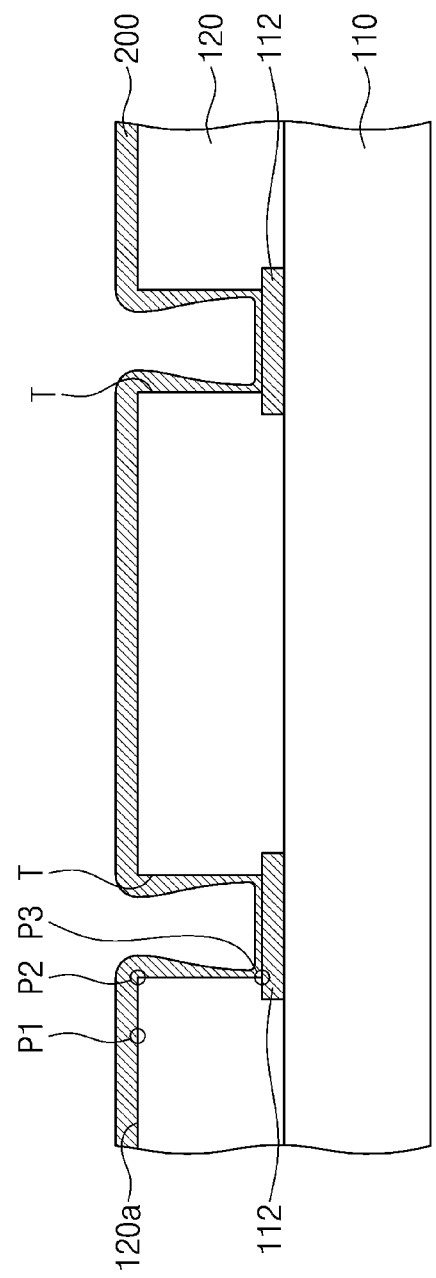

Referring to FIG. 17, a second conductive pattern 200 may be formed on the dielectric layer 120. For example, the second conductive pattern 200 may be formed by a deposition process in which a metallic material is deposited on the dielectric layer 120. A chemical vapor deposition (CVD) process may be performed to deposit the metallic material. The second conductive pattern 200 may be formed to have large step coverage. For example, a deposition rate may depend on position during the deposition process. For example, a reactant may reach at an arrival angle of about 180 degrees at a first point P1 positioned on the top surface 120a of the dielectric layer 120. The reactant may reach at an arrival angle of about 90 degrees at a second point P2 where the top surface 120a of the dielectric layer 120 meets an inner side surface of the trench T. The reactant may reach at an acute arrival angle less than about 90 degrees at a third point P3 positioned on a bottom surface of the trench T. The smaller width of the trench T, the lower arrival angle of the reactant at the third point P3. Therefore, the deposition rate may be maximum at the first point P1 and minimum at the third point P3. Thus, the second conductive pattern 200 may be formed thickest on the top surface 120a of the dielectric layer 120, and may be formed thinnest on the bottom of the trench T or on a portion of the inner side surface of the trench T adjacent to the bottom surface of the trench T. On the inner side surfaces of the trench T, the second conductive pattern 200 may be formed to have a thickness that increases in an upward direction approaching the top surface 120a of the dielectric layer 120 from the bottom surface of the trench T. The foregoing shape of the second conductive pattern 200 may allow the trench T to have therein an internal space which is defined by the second conductive pattern 200 and whose width decreases in an upward direction vertically receding from the first conductive pattern 112.

Figure 18:
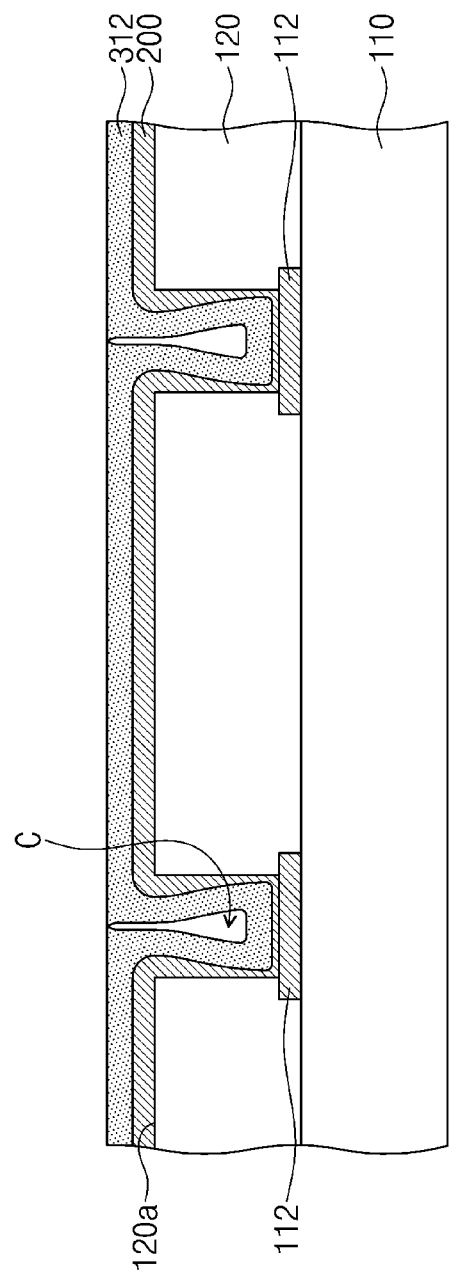

Referring to FIG. 18, a first preliminary protection layer 312 may be formed on the second conductive pattern 200. For example, the first preliminary protection layer 312 may be formed by a deposition process in which a dielectric material is deposited on the second conductive pattern 200. A plasma enhanced chemical vapor deposition (PECVD) process may be performed to deposit the dielectric material. The dielectric material may include tetraethoxysilane (TEOS). The first preliminary protection layer 312 may be formed to conformally cover the second conductive pattern 200. The first preliminary protection layer 312 may have a cavity C that is formed along a shape of the internal space defined by the second conductive pattern 200. The cavity C may have a width in a horizontal direction that decreases in an upward direction vertically receding from the first conductive pattern 112. Alternatively, the cavity C may have a water-drop shape in a cross-sectional view. For example, a lower portion of the cavity C may have a horizontal width decreasing in a downward direction approaching the first conductive pattern 112. As shown in FIG. 18, the cavity C may be positioned in the first preliminary protection layer 312, and may not be opened onto a top surface of the first preliminary protection layer 312. Alternatively, the cavity C may be positioned in the first preliminary protection layer 312, and may extend onto the top surface of the first preliminary protection layer 312. Therefore, the cavity C may be exposed on the top surface of the first preliminary protection layer 312, and may be spatially connected to an outside of the first preliminary protection layer 312 (e.g., to an outside of the cavity C).

Figure 19:
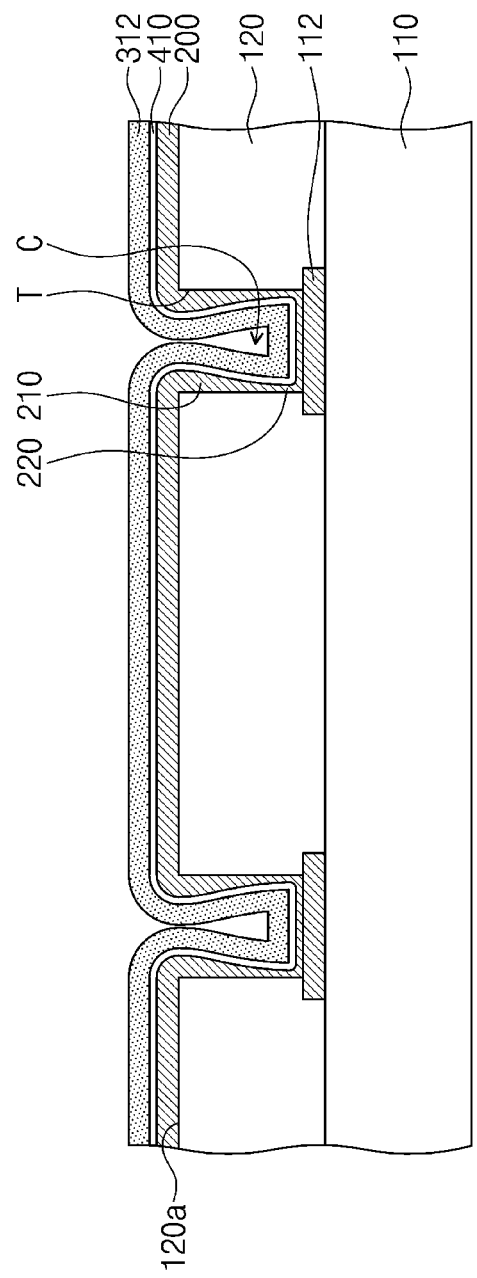

According to some embodiments, before the first preliminary protection layer 312 is formed, a first intermediate layer (see 410 of FIG. 19) may be formed in advance to facilitate the formation of the first preliminary protection layer 312. Referring to FIG. 19, the first intermediate layer 410 may be formed on the second conductive pattern 200. For example, the first intermediate layer 410 may be formed by depositing a dielectric material on the second conductive pattern 200. A high density plasma chemical vapor deposition (HDP-CVD) may be performed to deposit the dielectric material. Because the HDP-CVD uses high density plasma, it may be possible to obtain excellent gap-fill properties and to easily deposit the dielectric material in the trench T. The first intermediate layer 410 may be formed of the same material as that of the first preliminary protection layer 312. For example, the dielectric material may include or may be tetraethoxysilane (TEOS). The first intermediate layer 410 may be formed to conformally cover the second conductive pattern 200. Afterwards, a deposition process may be performed to form the first preliminary protection layer (see 312 of FIG. 18). Because the trench T has therein the first intermediate layer 410 deposited using the same material as that of the first preliminary protection layer 312, the first preliminary protection layer 312 may be easily deposited even when the trench T has a large thickness (e.g., when a depth of the trench T is great). In addition, because the first preliminary protection layer 312 is deposited by PECVD, the first preliminary protection layer 312 may be deposited at high rates. In this case, when the first intermediate layer 410 is formed, it may be easy to deposit the first preliminary protection layer 312 at high process rates. The aforementioned case may fabricate the semiconductor device discussed with reference to FIG. 8. The following will focus on the embodiment of FIG. 18 and its subsequent processes.

Figure 20:
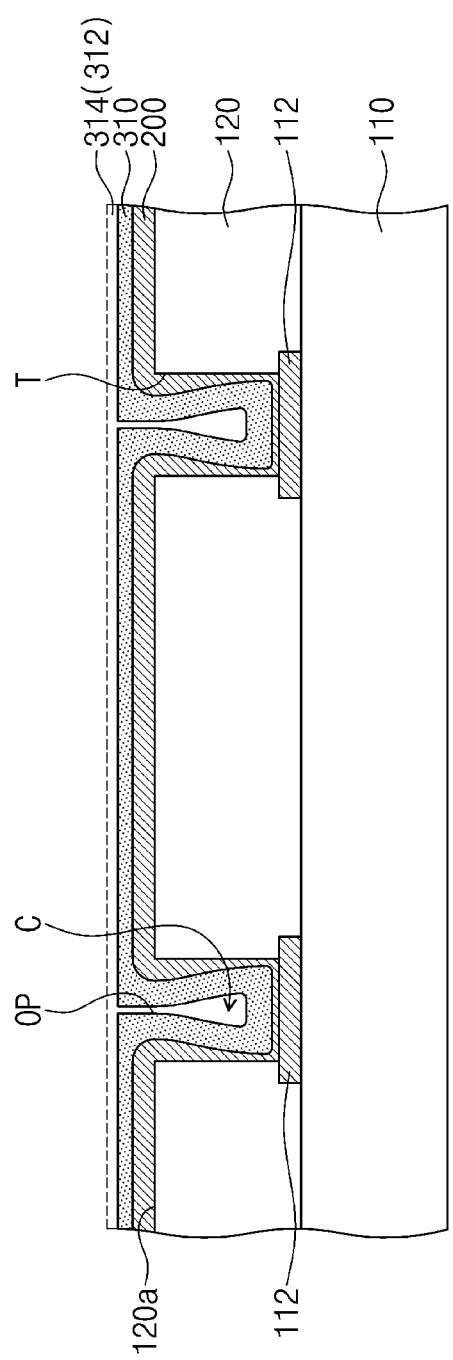

Referring to FIG. 20, a planarization process may be performed on the first preliminary protection layer 312. For example, a chemical mechanical polishing (CMP) process may be executed on a top surface of the first preliminary protection layer 312. The planarization process may remove an upper portion 314 of the first preliminary protection layer 312, thereby forming a first protection layer 310. A portion of the first preliminary protection layer 312 in the trench T may not be etched when the planarization process is performed, and a thickness of the first protection layer 310 positioned on the top surface 120*a* of the dielectric layer 120 may be less than a thickness of the first protection layer 310 positioned in the trench T. The first protection layer 310 may have a top surface that is substantially flat. Because the upper portion 314 is removed from the first preliminary protection layer 312, the cavity C may become opened. For example, during the planarization process, the first preliminary protection layer 312 covering the cavity C may also be removed. The cavity C may have a portion, defined as an opening OP, which spatially connects the cavity C formed in an upper portion of the first protection layer 310, e.g., within the trench T, to an outside of the first protection layer 310 (e.g., to the outside of the cavity C). Differently from that shown in FIG. 20, when the opening OP is formed during the planarization process, an amount of polishing may be greater in the vicinity of the opening OP than elsewhere, and thus the top surface of the first protection layer 310 may be partially concave in the vicinity of the opening OP.

Figure 21:
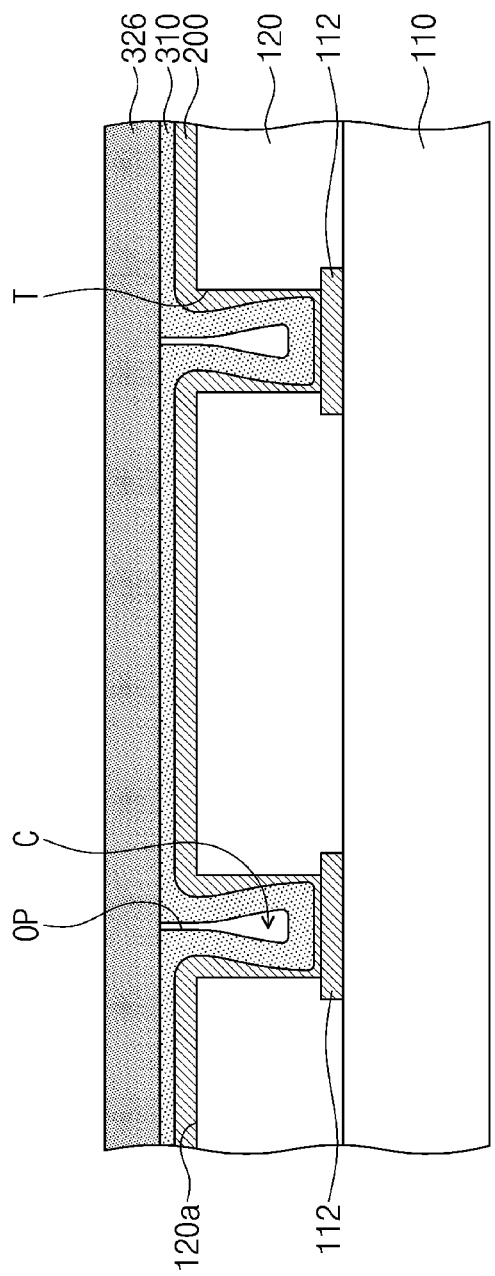

Referring to FIG. 21, a second preliminary protection layer 326 may be formed on the first protection layer 310. For example, the second preliminary protection layer 326 may be formed by depositing a dielectric material on the first protection layer 310. A plasma enhanced chemical vapor deposition (PECVD) process may be performed to deposit the dielectric material. The dielectric material may include or may be tetraethoxysilane (TEOS). The dielectric material may cover the top surface of the first protection layer 310 and may also cover the opening OP formed in the first protection layer 310. Therefore, the cavity C may be hermetically closed by the first protection layer 310 and the second preliminary protection layer 326.

Figure 22:
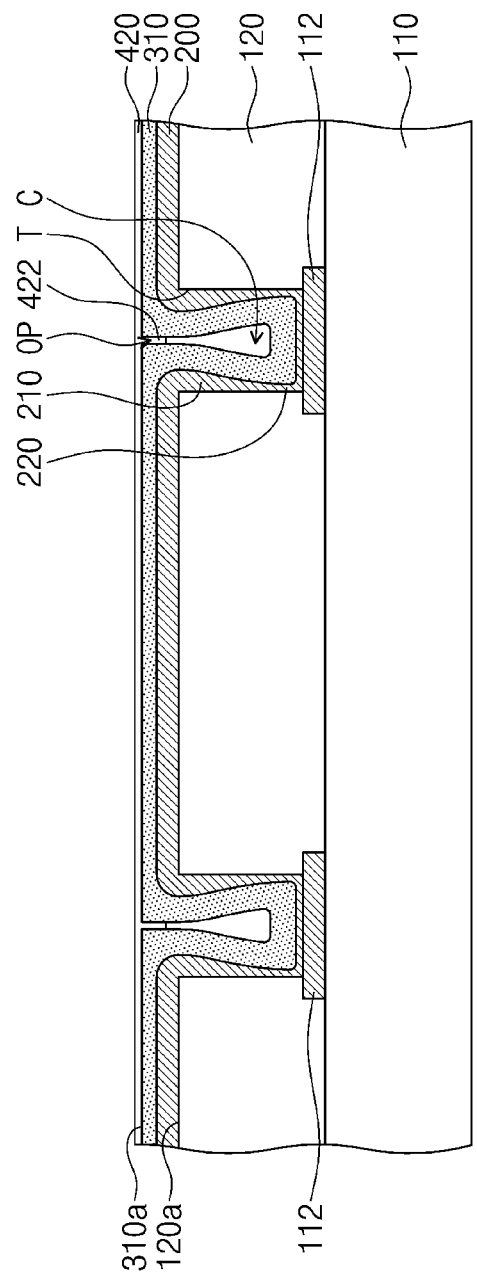

According to some embodiments, before the second preliminary protection layer 326 is formed, a second intermediate layer (see 420 of FIG. 22) may be formed in advance to facilitate the formation of the second preliminary protection layer 326. Referring to FIG. 22, the second intermediate layer 420 may be formed on the first protection layer 310. For example, the second intermediate layer 420 may be formed by depositing a dielectric material on the first protection layer 310. A high density plasma chemical vapor deposition (HDP-CVD) may be performed to deposit the dielectric material. Because the HDP-CVD uses high density plasma, it may be possible to obtain excellent gap-fill properties and to easily deposit the dielectric material in the opening OP. The second intermediate layer 420 may be formed of the same material as that of the second preliminary protection layer 326. For example, the dielectric material may include or may be tetraethoxysilane (TEOS). The second intermediate layer 420 may be formed to cover the top surface 310*a* of the first protection layer 310 and to fill at least a portion of the opening OP. Afterwards, a deposition process may be performed to form the second preliminary protection layer (see 326 of FIG. 21). The aforementioned case may fabricate the semiconductor device discussed with reference to FIG. 10. The following will focus on the embodiment of FIG. 21 and its subsequent processes.

Figure 23:
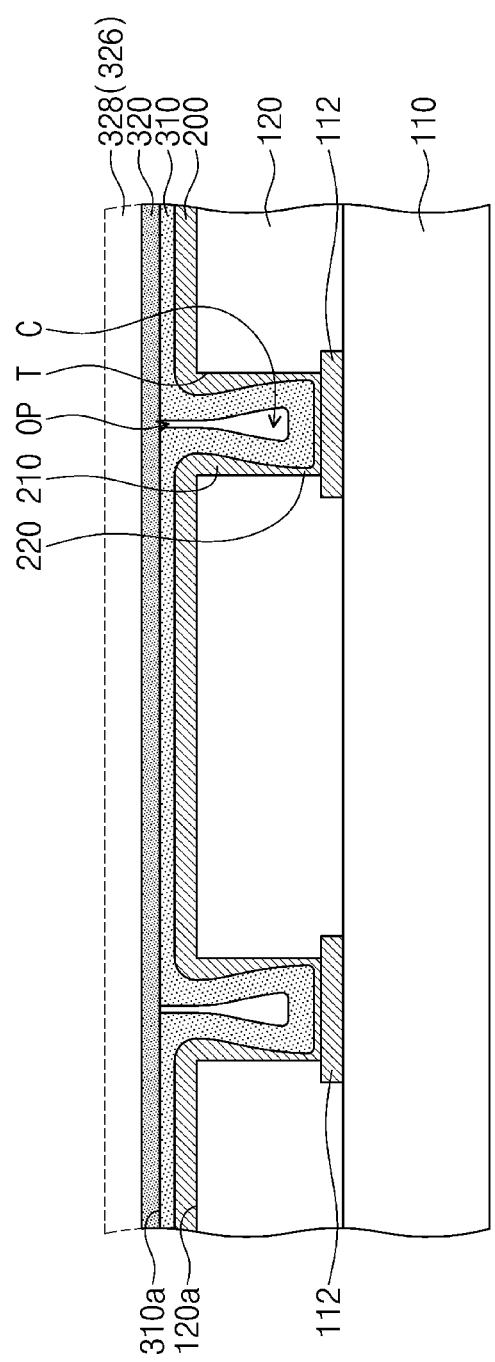

Referring to FIG. 23, a planarization process may be performed on the second preliminary protection layer 326. For example, a chemical mechanical polishing (CMP) process may be executed on a top surface of the second preliminary protection layer 326. The planarization process may remove an upper portion 328 of the second preliminary protection layer 326, thereby forming a second protection layer 320. The second protection layer 320 may have a top surface that is substantially flat.

It may therefore be possible to fabricate the semiconductor device discussed with reference to FIGS. 1 and 2.

A semiconductor device according to some embodiments of the present inventive concepts may be configured such that a damage-susceptible cavity is not exposed on a second protection layer, thereby being robust to external impact. Furthermore, the second protection layer has flatness of a top surface thereof may be greater than flatness of a top surface of a first protection layer, and accordingly other processes may be easily performed on the top surface of the second protection layer.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

We claim:
1. A semiconductor device, comprising:
a dielectric layer;
a trench formed in the dielectric layer;
a metal pattern that conformally covers a top surface of the dielectric layer, an inner side surface of the trench, and a bottom surface of the trench;

a first protection layer that conformally covers the metal pattern; and a second protection layer that covers the first protection layer, wherein a cavity is formed in the trench, the cavity being surrounded by the first protection layer, wherein the first protection layer has an opening that penetrates the first protection layer and extends from a top surface of the first protection layer to the cavity, the opening being connected to the cavity, and wherein a portion of the second protection layer extends into the opening to fill the opening so that at least a portion of the cavity remains in the trench.

2. The semiconductor device of claim 1, wherein the metal pattern on the inner side surface of the trench has a first part adjacent to the top surface of the dielectric layer and a second part adjacent to the bottom surface of the trench, wherein a thickness of the first part is greater than a thickness of the second part.

3. The semiconductor device of claim 1, wherein a thickness of the first protection layer on the top surface of the dielectric layer is less than a thickness of the first protection layer in the trench.

4. The semiconductor device of claim 1, wherein a top surface of the second protection layer is flatter than the top surface of the first protection layer.

5. The semiconductor device of claim 1, wherein a width of the trench is in a range of about 5 μm to about 10 μm.

6. The semiconductor device of claim 1, wherein a width of the cavity decreases in a direction approaching a top of the trench.

7. The semiconductor device of claim 1, wherein a thickness of the first protection layer on the top surface of the dielectric layer is less than a thickness of the second protection layer.

8. The semiconductor device of claim 1, wherein a width of the opening is substantially uniform throughout the opening.

9. The semiconductor device of claim 1, further comprising a first intermediate layer between the metal pattern and the first protection layer, wherein a width of the opening decreases in a direction approaching the bottom surface of the trench.

10. A method of fabricating a semiconductor device, the method comprising:

forming a trench by performing an etching process on a dielectric layer;

forming a metal pattern that conformally covers a top surface of the dielectric layer, an inner side surface of the trench, and a bottom surface of the trench, wherein a thickness of the metal pattern on the inner side surface of the trench decreases in a direction approaching the bottom surface of the trench;

forming a first preliminary protection layer that conformally covers the metal pattern, wherein the first preliminary protection layer has a cavity in the trench;

forming a first protection layer by performing a first planarization process on a top surface of the first preliminary protection layer, wherein after the first planarization process the cavity is connected to an outside through an opening formed in an upper portion of the first protection layer;

forming a second preliminary protection layer that covers a top surface of the first protection layer and fills the opening, so that at least a portion of the cavity remains in the trench; and forming a second protection layer by performing a second planarization process on a top surface of the second preliminary protection layer.

11. The method of claim 10, wherein the cavity is enclosed in the first preliminary protection layer, and the opening is formed in the upper portion of the first protection layer by the first planarization process.

12. The method of claim 10, wherein, when the forming the first preliminary protection layer, the opening is formed in an upper portion of the first preliminary protection layer, the opening connecting the cavity to the outside.

13. The method of claim 10, wherein, after the first planarization process, a thickness of the first protection layer in the trench is greater than a thickness of the first protection layer on the top surface of the dielectric layer.

14. A semiconductor device, comprising:

a base layer;

a first conductive pattern on the base layer;

a dielectric layer disposed on the base layer and covering the first conductive pattern;

a trench that penetrates the dielectric layer and exposes the first conductive pattern;

a second conductive pattern that extends into the trench from a top surface of the dielectric layer and is electrically coupled to the first conductive pattern, the second conductive pattern conformally covering an inside of the trench;

a first protection layer that covers the second conductive pattern on the dielectric layer and in the trench; and a second protection layer that covers the first protection layer, wherein the first protection layer surrounds a cavity in the trench, the cavity being hermetically closed by the first protection layer and the second protection layer, and wherein, in the trench, a thickness of a first part of the second conductive pattern is greater than a thickness of a second part of the second conductive pattern, the first part being adjacent to the top surface of the dielectric layer, and the second part being adjacent to a bottom surface of the trench.

15. The semiconductor device of claim 14, wherein, above the trench, the second protection layer penetrates the first protection layer and plugs a topmost end of the cavity, so that a portion of the cavity remains below the second protection layer.

16. The semiconductor device of claim 14, wherein a thickness of the first protection layer on the top surface of the dielectric layer is less than a thickness of the first protection layer in the trench.

17. The semiconductor device of claim 14, wherein a top surface of the second protection layer is smoother than a top surface of the first protection layer.

18. The semiconductor device of claim 14, wherein a width of the cavity increases in a direction approaching the base layer.

19. The semiconductor device of claim 14, wherein, on the top surface of the dielectric layer, a thickness of the first protection layer is less than a thickness of the second protection layer.

20. The semiconductor device of claim 14, further comprising an intermediate layer between the first protection layer and the second protection layer, wherein the first protection layer has an opening that penetrates the first protection layer and extends from a top surface of the first protection layer, the opening being connected to the cavity, and wherein a portion of the intermediate layer extends into the opening.

* * * * *